(12) United States Patent
Watanabe

(10) Patent No.: US 9,679,996 B2
(45) Date of Patent: Jun. 13, 2017

(54) SEMICONDUCTOR DEVICE HAVING BURIED REGION BENEATH ELECTRODE AND METHOD TO FORM THE SAME

(71) Applicant: SUMITOMO ELECTRIC INDUSTRIES, LTD., Osaka (JP)

(72) Inventor: Masataka Watanabe, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/088,747

(22) Filed: Apr. 1, 2016

(65) Prior Publication Data

US 2016/0293742 A1 Oct. 6, 2016

(30) Foreign Application Priority Data

Apr. 2, 2015 (JP) ................................. 2015-075750
Apr. 2, 2015 (JP) ................................. 2015-075752

(51) Int. Cl.
*H01L 29/737* (2006.01)
*H01L 29/205* (2006.01)
*H01L 29/08* (2006.01)
*H01L 29/06* (2006.01)
*H01L 29/66* (2006.01)

(52) U.S. Cl.
CPC ...... *H01L 29/7371* (2013.01); *H01L 29/0649* (2013.01); *H01L 29/0821* (2013.01); *H01L 29/205* (2013.01); *H01L 29/66242* (2013.01); *H01L 29/66272* (2013.01)

(58) Field of Classification Search
CPC ............... H01L 29/7371; H01L 29/207; H01L 29/0821; H01L 21/31116; H01L 29/205; H01L 21/31055; H01L 21/31138; H01L 29/0649; H01L 21/30612
See application file for complete search history.

(56) References Cited

U.S. PATENT DOCUMENTS

| 6,888,180 B2 * | 5/2005 | Kotani | ................ H01L 29/0821 257/191 |
| 8,120,147 B1 * | 2/2012 | Sugg | ................... H01L 29/0817 257/562 |
| 8,598,613 B2 * | 12/2013 | Kim | ........................ H01L 33/14 257/98 |

FOREIGN PATENT DOCUMENTS

JP    H5-36713    2/1993

* cited by examiner

*Primary Examiner* — William Coleman
(74) *Attorney, Agent, or Firm* — Smith, Gambrell & Russell, LLP.

(57) ABSTRACT

A semiconductor device and a process to form the same are disclosed. The semiconductor device includes a support, an active semiconductor stack including a first semiconductor layer, a second semiconductor layer, and a third semiconductor layer, the first to third semiconductor layers being sequentially stacked on the support, and an electrode on the third semiconductor layer. The first semiconductor layer and the second semiconductor layer provide a buried region in a portion under the electrode, the buried region being filled with a material having a first dielectric constant smaller than a second dielectric constant of the first semiconductor layer and a third dielectric constant of the second semiconductor layer.

16 Claims, 23 Drawing Sheets

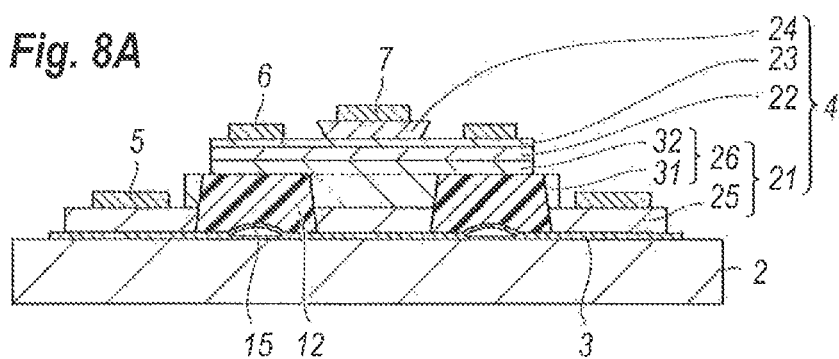
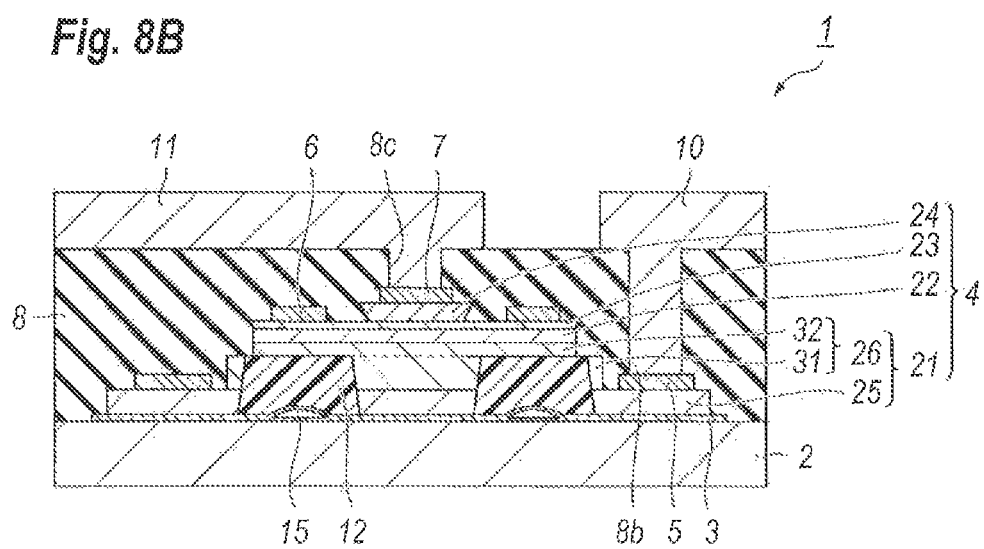

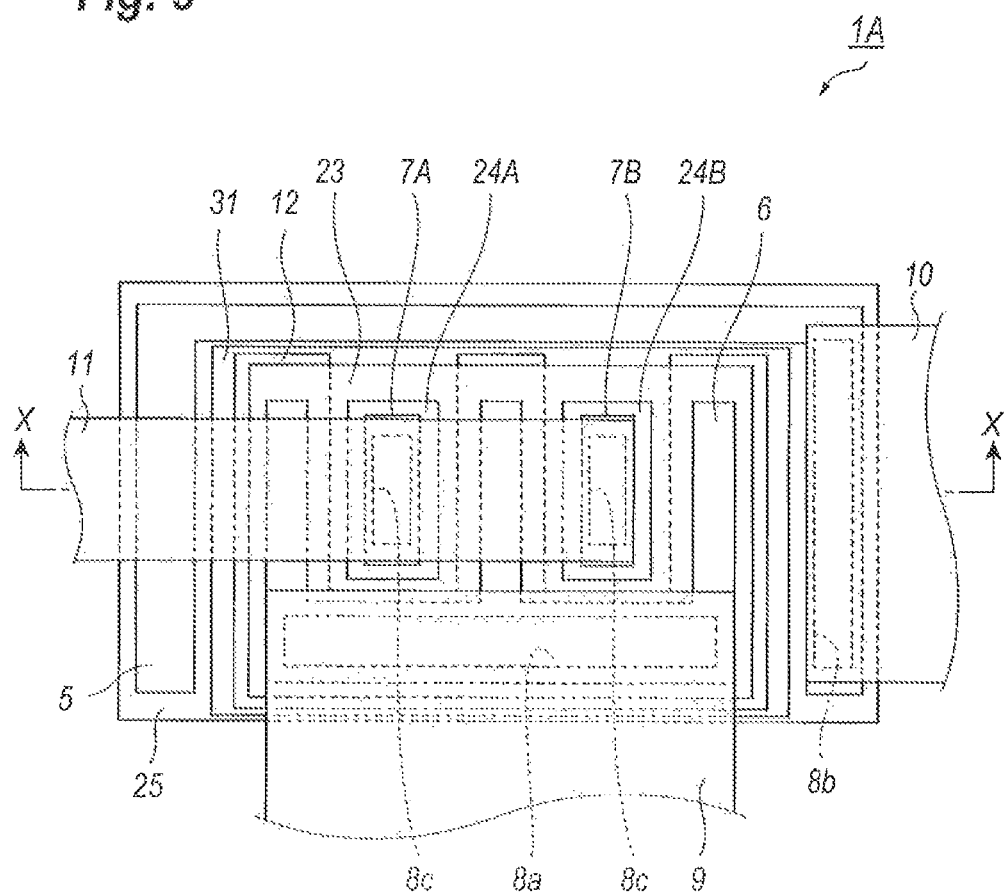

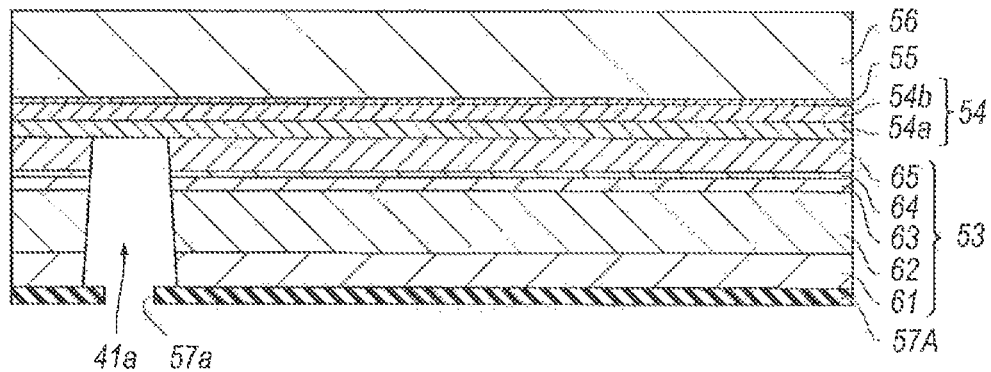
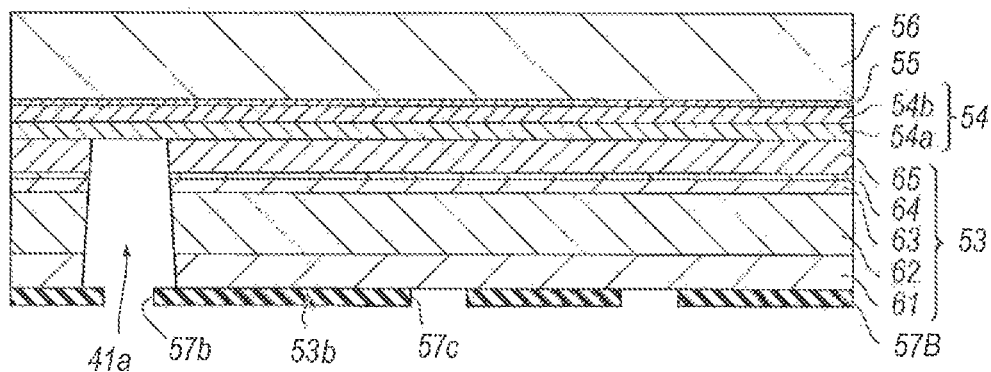
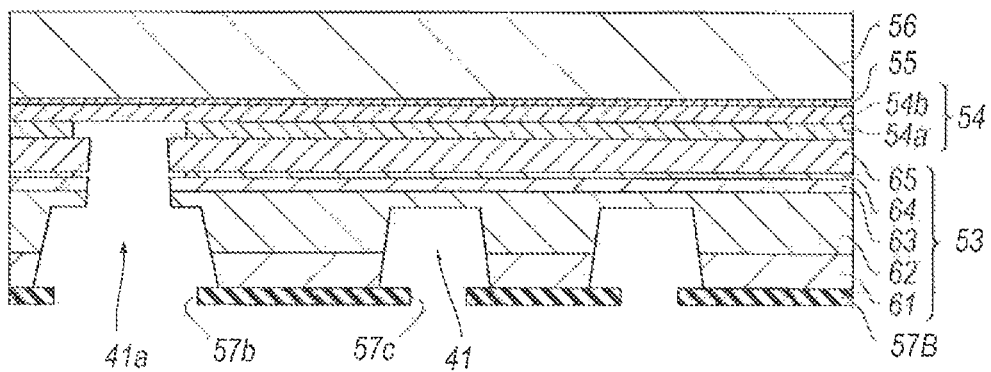

SEMICONDUCTOR DEVICE HAVING BURIED REGION BENEATH ELECTRODE AND METHOD TO FORM THE SAME

BACKGROUND OF THE INVENTION

1. Field of the Invention

The present invention relates to a semiconductor device, in particular, a semiconductor device having a structure of a hetero-bipolar transistor, and a method of forming the semiconductor device.

2. Related Prior Arts

Continuous requests for a semiconductor device to be operable in a higher speed have become stronger as communication devices have become faster. One solution for such requests is provided by a hetero-junction bipolar transistor (HBT) primarily made of compound semiconductor materials. Various prior arts have reported an HBT including, on a semi-insulating GaAs substrate, an n-type GaAs collector layer, a p-type GaAs base layer, and a composite emitter layer of an n-type InGaP and an n-type AlGaAs, where the emitter layer has energy band gap wider than those of the base layer and the collector layer. When an HBT becomes operable in frequencies exceeding several scores of giga-hertz, sometimes reaching a hundred of giga-hertz, parasitic components around electrodes of the HBT are necessary to be further reduced.

SUMMARY OF THE INVENTION

One aspect of the present application relates to a semiconductor device. The semiconductor device according to an embodiment includes a support, and active semiconductor stack, and an electrode. The active semiconductor stack includes first to third semiconductor layers sequentially stacked on the support in this order. The electrode is provided on the third semiconductor layer. A feature of the semiconductor device is that the first and second semiconductor layers provide buried region in a portion under the electrode, and the buried region is filled with a material whose dielectric constant smaller than those of the first and second semiconductor layers.

In a modification of the embodiment above, the buried region may be provided only in the first semiconductor layer. In still another modification of the embodiment, the semiconductor device further provides a metal layer between the support and the active semiconductor stack, and the buried region has an O-shape plane shape that surrounds an active region of the active semiconductor stack. Another electrode is provided on the metal layer and outside of the buried region.

Another aspect of the present application relates to a process to from a semiconductor device having the buried region under an electrode. The process includes steps of: (a) growing first to third semiconductor layers sequentially on a semiconductor substrate to form an active semiconductor stack; (b) attaching a temporary substrate on a top of the active semiconductor stack; (c) removing the semiconductor substrate from the active semiconductor stack; (d) digging a recess in the active semiconductor stack from a side of the first semiconductor layer; (e) attaching a support to the first semiconductor layer; (f) removing a temporary substrate from the active semiconductor stack; and (g) forming an electrode on the third semiconductor layer at a position above the recess.

BRIEF DESCRIPTION OF THE DRAWINGS

The foregoing and other purposes, aspects and advantages will be better understood from the following detailed description of a preferred embodiment of the invention with reference to the drawings, in which:

FIGS. 8A and 8B show processes subsequent to the process shown in FIG. 7C;

FIG. 9 is a plan view of a semiconductor device modified from the semiconductor device shown in FIG. 1;

FIG. 10 is taken along the line X-X indicated in FIG. 9;

FIG. 13 is taken along the line XIII-XIII indicated in FIG. 12;

FIG. 15 is taken along the line XV-XV indicated in FIG. 14;

FIGS. 19A to 19C show processes subsequent to the process shown in FIG. 18C;

DESCRIPTION OF EMBODIMENT

Next, some embodiments according to the present invention will be described as referring to drawings. In the description of the drawings, numerals or symbols same with or similar to each other will refer to elements same with or similar to each other without duplicating explanations.

First Embodiment

Figure 1:
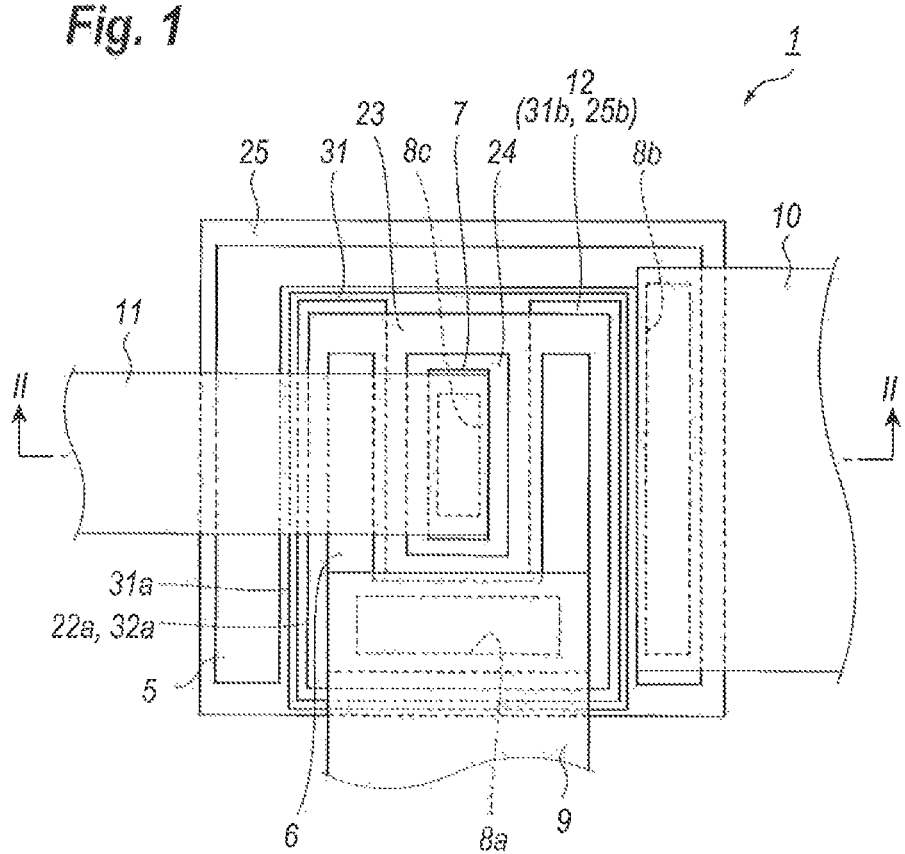
FIG. 1 is a plan view of a semiconductor device according to the first embodiment of the present invention.
Figure 2:
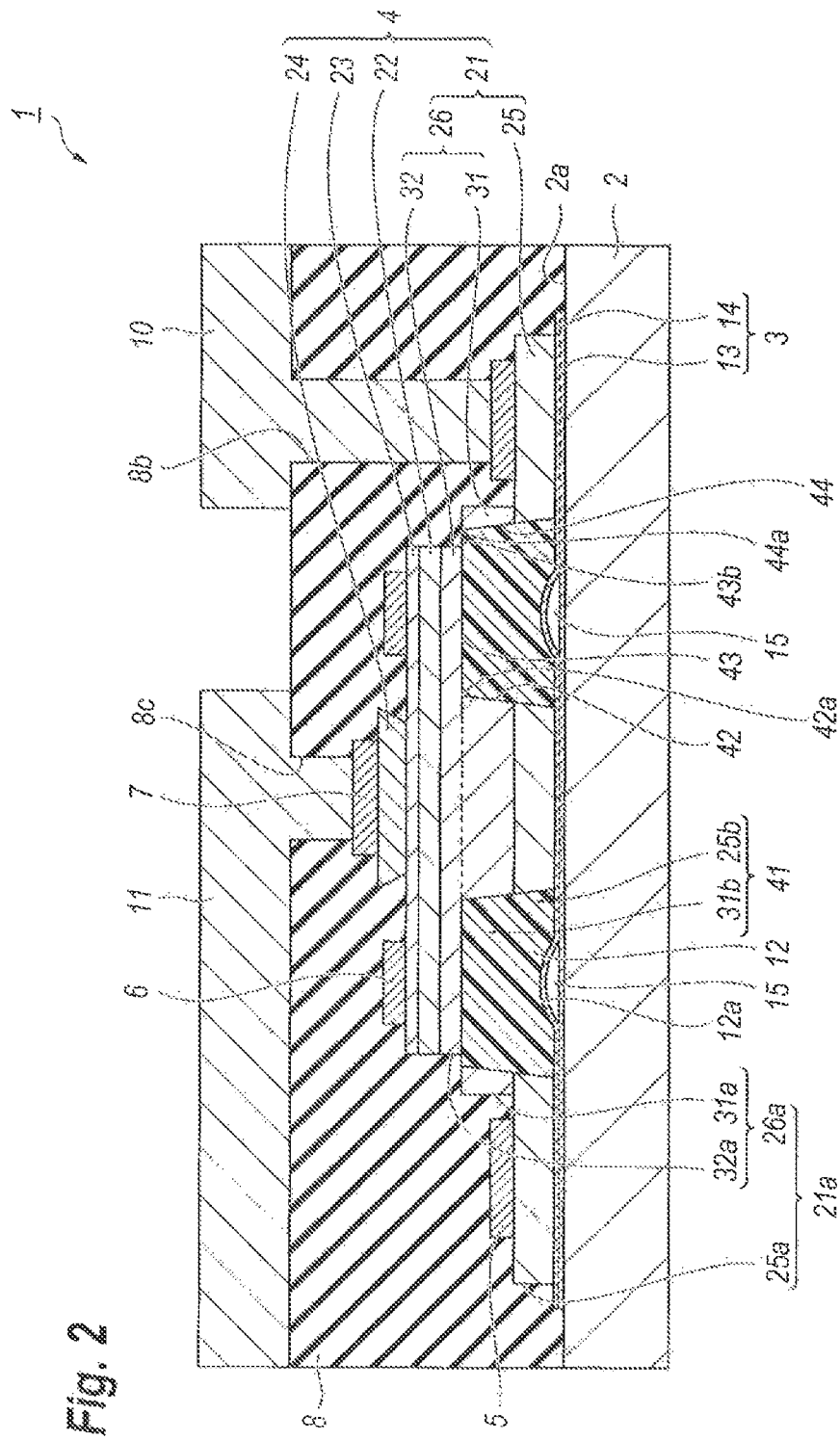
FIG. 2 shows a cross section taken along the line II-II indicated in FIG. 1.

FIG. 1 is a plan view of a semiconductor device 1 according to the first embodiment; FIG. 2 shows a cross section of the semiconductor device 1 shown in FIG. 1, which is taken along the line II-II indicated in FIG. 1. As illustrated in FIGS. 1 and 2, the semiconductor device 1 is a type of hetero-bipolar transistor (HBT) mounted on a support substrate 2. The semiconductor device 1 includes a metal layer 3 provided on a primary surface 2a of the support substrate 2, an active semiconductor stack 4 provided on the metal layer 3; electrodes, 5 to 7, provided on the active semiconductor stack 4; an insulating film 8 that buries the active semiconductor stack 4 and the electrodes, 5 to 7; and interconnections, 9 to 11. One of features of the semiconductor device 1 is that portions of the active semiconductor stack 4 under the electrode 6 are removed to form a buried region 12.

The support substrate 2, which has relatively good thermal conductivity compared with that of indium phosphide (InP) that is a conventional material for a substrate of a conventional HBT device, may be made of aluminum nitride (AlN), silicon (Si), silicon carbide (SiC), and/or diamond (C). The support substrate 2 has a thickness of 20 to 200 μm and the thermal conductivity of greater than 100 W/m/K but limited to less than 2000 W/m/K, which is a highest thermal conductivity of a commercially available material. Also, the support substrate 2 has a thermal expansion co-efficient of 1 to 5 ppm/° C.

The metal layer 3, which is provided between the support substrate 2 and the active semiconductor stack 4, may attach the active semiconductor stack 4 securely to the support substrate 2. The metal layer 3 may be made of at least one of tungsten (W), molybdenum (Mo), and tantalum (Ta), or alloy containing at least one of those metals. The metal layer 3 has a thickness greater than 10 nm to prevent the active semiconductor stack 4 from peeling off from the support substrate 2 but preferably less than 60 nm to conduct heat generated in the active semiconductor stack 4 efficiently to the support substrate 2. From a view point of the heat dissipation, the metal layer 3 may have a thickness less than 40 nm.

The metal layer 3 may be a composite arrangement including a first metal layer 13 and a second metal layer 14, where the first and second metal layers, 13 and 14, may be made of materials same to each other, or different from each other. These metal layers, 13 and 14, form voids (or gaps) 15 in a buried region 12 where the active semiconductor stack 4 is partially removed. The voids 15 may leave an air therein, or may be set in a vacuum.

The active semiconductor stack 4 includes semiconductor layers each made of group III-V compound semiconductor materials. Specifically, the active semiconductor stack 4 includes, from the side of the support substrate 2, a collector layer 21, a base layer 22, an emitter layer 23, and an emitter contact layer 24.

The collector layer 21 includes a first collector layer, which is often called as a sub-collector layer 25, and a second collector layer, which is called as a main collector layer 26. The main collector layer 26 is formed inside of the sub-collector layer 25, that is, the main collector layer 26 has outer sides 26a inside of outer sides 25a of the sub-collector layer 25. The sub-collector layer 25, which is in contact to the metal layer 3, may be made of n-type InP with a thickness of about 300 nm and doped with silicon (Si) by a concentration of, for instance, $2 \times 10^{19}$ cm$^{-3}$. Indium phosphide (InP) has dielectric constant of 12.4 and the thermal expansion co-efficient of 4.5 ppm/° C.

The main collector layer 26 may have two portions including a lower portion 31 made of n-type InP with a thickness of 200 nm and an upper portion 32 made of n-type InAlGaAs with a thickness of 50 nm. The lower portion 31 may be doped with Si by a concentration of $3 \times 10^{16}$ cm$^{-3}$; while, the upper portion 32 may be dope also with Si by a concentration $1 \times 10^{17}$ cm$^{-3}$. The lower portion 31 has an area fully overlapping the upper portion 32, that is, the lower portion 31 has an outer side 31a outside of an outer side 32a of the upper portion 32 but inside of an outer side 25a of the sub-collector layer 25. These layers in the active semiconductor stack 4 are sequentially grown; that is the sub-collector layer 25 is epitaxially grown as the first layer, the main collector layer 26 is next grown as the second layer, the base layer 22 is next grown as the third layer, and so on.

Referring to FIGS. 1 and 2, the sub-collector layer 25 provides a U-shaped recess 25b which is formed inside of the outer edge 31a of the lower portion 31 of the sub-collector layer 26 but outside of the emitter contact layer 24. The lower portion 31 also provides a recess 31b that overlaps with the recess 25b but exposes a surface of the upper portion 32 facing the support substrate 2. The recess 31b in an outer edge thereof is positioned outside of the outer side 32a of the upper portion 32 so as to fully pass the lower portion 31. Thus, the collector layer 21 provides a recess 41 formed by two recesses, 25b and 31b.

The recess 41 of the collector layer 21 provides first to third boundaries. The first boundary, which corresponds to an inner boundary 42 of the recess 41, is positioned outside of the emitter contact layer 24. The second boundary, namely the top boundary 43, corresponds to the bottom surface of the upper portion 32 of the main collector layer 26, and extends from an edge 42a of the inner boundary 42 outward. The third boundary, which corresponds to an outer boundary 44 of the recess 41, is positioned outside of the outer edge 32a of the upper portion 32 of the main collector layer 26. The boundaries, 42 and 44, exist in both of the sub-collector layer 25 and the main collector layer 26, while, the top boundary 43 exists only in the main collector layer 26. An end 43b of the top boundary 43 coincides with the outer edge 32a of the upper portion 32, which is inside of the end 44a of the outer boundary 44.

The base layer 22 may be made of p-type InGaAs with a thickness of about 400 nm and a carbon (C) concentration of $5 \times 10^{19}$ cm$^{-3}$. The emitter layer 23 may be made of n-type InP with a thickness of 150 nm and a silicon (Si) concentration of $2 \times 10^{18}$ cm$^{-3}$. The emitter contact layer 24 may be made of n-type InGaAs with a thickness of about 250 nm and a silicon concentration of $2 \times 10^{19}$ cm$^{-3}$.

The electrode 5 is a collector electrode in contact to the sub-collector layer 25; the electrode 6 is a base electrode in contact to the base layer 22 exposed from the emitter layer 24; and the electrode 7 is an emitter electrode in contact to a top of the emitter contact layer 23. These electrodes, 5 to 7, may be made of metal stack including platinum (Pt) with a thickness of 10 nm, titanium (Ti) with a thickness of 30 nm, other platinum (Pt) with a thickness of 30 nm, and gold (Au) with a thickness of 100 nm.

The insulating film 8, which covers the active semiconductor stack 4 and is partially in contact to the buried region 12, may be formed by a stack of silicon oxi-nitride (SiON) and silicon nitride (SiN); or the insulating film 8 may be made of silicon oxide (SiOx) and/or organic material such as polyimide. The insulating film 8 provides openings, 8a to 8c, corresponding to the respective electrodes, 5 to 7. The interconnections, 9 to 11, are electrically connected to the electrodes, 6, 5, and 7, in the openings, 8a to 8c, respectively. These interconnections, 9 to 11, may be formed by metal stack including titanium (Ti) with a thickness of 30 nm, platinum (Pt) with a thickness of 50 nm, and gold (Au) with a thickness of 500 nm.

The buried region 12 formed in the recess 41 in the collector layer 21 are each formed by the inner boundary 42, the top boundary 43, and the outer boundary 44. A feature of the semiconductor device 1 of the present application is that the buried region 12 may be overlapped with the base electrode 6 and may have the U-shaped plain arrangement. Also, because the recess 41 in the top thereof exposes in the top surface of the lower portion 31, an outer portion of the buried region 12 is exposed from the lower portion 31 of the main collector layer 26. The buried region 12, which is filled with insulating resin in the present embodiment, partially surrounds the active semiconductor stack 4 just beneath the emitter contact layer 24. Accordingly, carriers injected from the emitter contact layer 24, passing through the base layer 22, passing the lower portion 31 of the main collector layer 26 and the sub-collector later 25 within the U-shaped plane arrangement of the buried region 12, reach the collector electrode 5 provided outside of the U-shaped arrangement of the buried region 12 through a portion of the sub-collector layer 25 corresponding to an area opened between vertical bars of the U-character. Some of carriers injected into the emitter contact layer 24 may reach the collector electrode 5 passing through the metal layer 3. Although cross sectional views of the drawings illustrate the collector electrodes 5 in respective outer sides of the base electrodes 6, the collector electrode 5 may be preferably provided in a position corresponding to the opening of the U-shaped arrangement of the buried region 12.

Resin filling the buried region 12 generally has a dielectric constant smaller than that of the collector layer 21, where the collector layer 21 of the present embodiment is made of InP with the dielectric constant of 12.4. Thus, the resin having the dielectric constant of, for instance, 2 to 6, may show a function to reduce parasitic capacitance of the semiconductor device 1. Benzo-Cyclo-Butene (BCB), which has a dielectric constant of 2.6 enough smaller than that of InP but shows relatively greater thermal expansion co-efficient of 52 ppm/° C., may be applicable to fill the buried region 12. Although resin has a thermal expansion co-efficient relatively larger than that of semiconductor materials, the buried region 12 of the present embodiment has hollows 12a forming the voids 15; and the hollows 12a or the voids 15 may effectively compensate with the thermal expansion of the resin filling the buried region 12.

Next, a process to form a semiconductor device according to the first embodiment of the present application will be described as referring to FIGS. 3A to 8B.

Figure 3A:
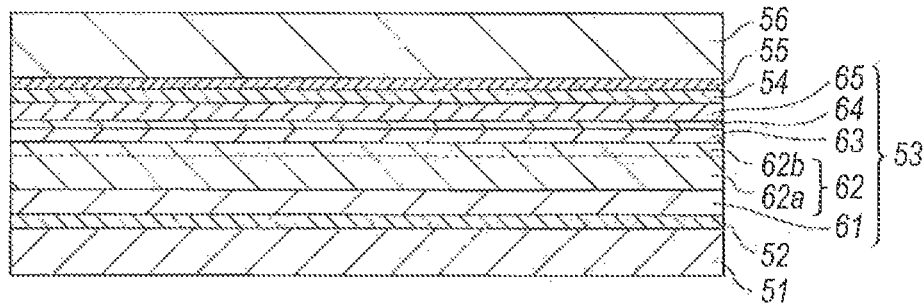
FIGS. 3A to 3C show processes to form the semiconductor device shown in FIG. 1.

First, the process forms, as the first step shown in FIG. 3A, the semiconductor substrate 51 on which a cover layer 52, a semiconductor stack 53, a cover layer 54, an adhesive layer 55, and a temporary support 56 are provided. Specifically, the cover layer 52, the semiconductor stack 53, and the cover layer 54 are sequentially grown on the semiconductor substrate 51, where the cover layer 54 provides a metal layer on a top thereof. On the other hand, the temporary support 56, which is unnecessary to be made of semiconductor material, also provides a metal layer on a top thereof. Making the metal layer on the top of the cover layer 54 closely in contact to the other metal layer on the top of the temporary support 56, the adhesive layer 55 made of metal may be formed. The adhesion of two metal layers may be carried out by, for instance, the atomic diffusion bonding (ADB).

The semiconductor substrate 51 may be made of group III-V compound semiconductor material, typically, indium phosphide (InP). The cover layer 52 preferably shows an etching rate far smaller than that of the semiconductor stack 53, that is, the cover layer 52 preferably has a function of an etching-stop layer for the semiconductor substrate 51. The cover layer 52 may be made of epitaxially grown InGaAs with a thickness of about 200 nm.

The semiconductor stack 53 includes semiconductor layers, 61 to 65, each corresponding to the sub-collector layer 25 as the first layer, the main collector layer 26 as the second layer, the base layer 22 as the third layer, the emitter layer 23 as the fourth layer, and the emitter contact layer 24 as the fifth layer, respectively. The semiconductor layer 62 includes layers, 62a and 62b, each corresponding to the lower portion 31 and the upper portion 32 indicated in FIG. 2. The semiconductor layers, 61 to 65, may be formed by the epitaxial growth.

The cover layer 54 preferably has an etching rate far greater than that for the semiconductor layer 65, that is, the semiconductor layer 65 in the top of the semiconductor stack 53 plays a roll of the etching-stop layer with respect to the cover layer 54. The cover layer 54 may be also formed by the epitaxial growth. The adhesive layer 55, or the metals on the top of the temporary support 56 and the cover layer 54, may be made of tungsten (W) formed by, for instance, sputtering.

Figure 3B:
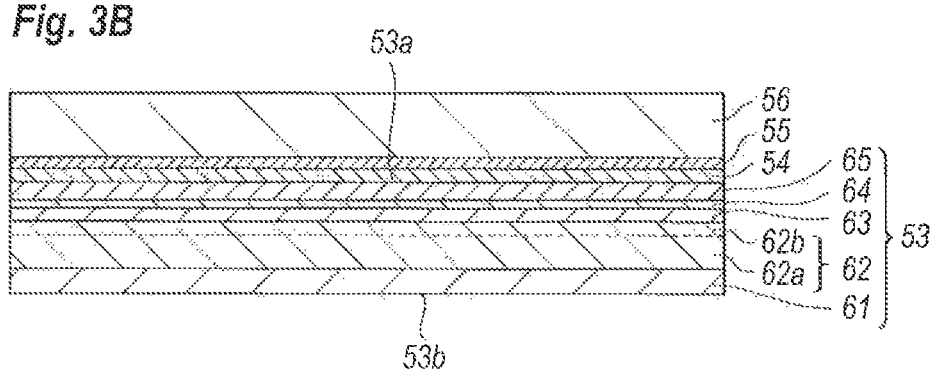
Figure 3C:
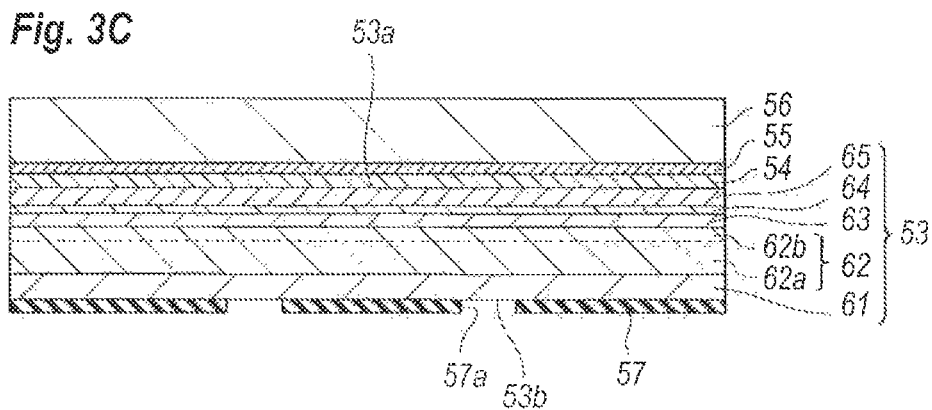

The process of the invention next removes, as the second step shown in FIG. 3B, the semiconductor substrate 51 and the cover layer 52 from the semiconductor stack 53 by dry-etching and/or wet-etching. Further, as the third step shown in FIG. 3B, the process forms a patterned etching mask 57 on a back surface 53b of the semiconductor stack 53, which is opposite to a top surface 53a on which the cover layer 54 is provided. The etching mask 57, which may be made of silicon compound, typically silicon nitride (SiN) or silicon oxide (SiOx), has an opening 57a that exposes the back surface 53b of the semiconductor stack 53, as shown in FIG. 3C.

Figure 4A:
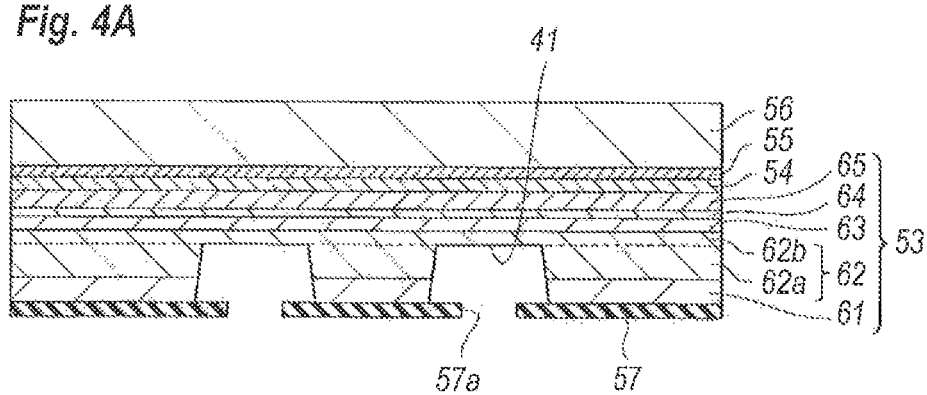
FIGS. 4A to 4C show processes to from the semiconductor device of FIG. 1 subsequent to the process shown in FIG. 3C.

Next, the process, as the fourth step shown in FIG. 4A, etches a portion of the semiconductor stack 53 exposed from the etching mask 57. Specifically, wet-etching the semiconductor layers, 61 and 62, by an etchant of a chloric acid (HCl); the process digs the recess 41 within the semiconductor stack 53. Because the semiconductor layers, 61 and 62, are made of InP, chloric acid (HCl) may easily etch the semiconductor layers, 61 and 62. Also, not explicitly illustrated in the figures, the recess 41 has the U-shaped plane arrangement. The recess 41 has a width wider than a width of the opening 57a because the wet-etching using chloric acid (HCl) homogeneously erodes an InP. The wet-etching may take a time of several minutes to several scores of minutes.

Figure 4B:
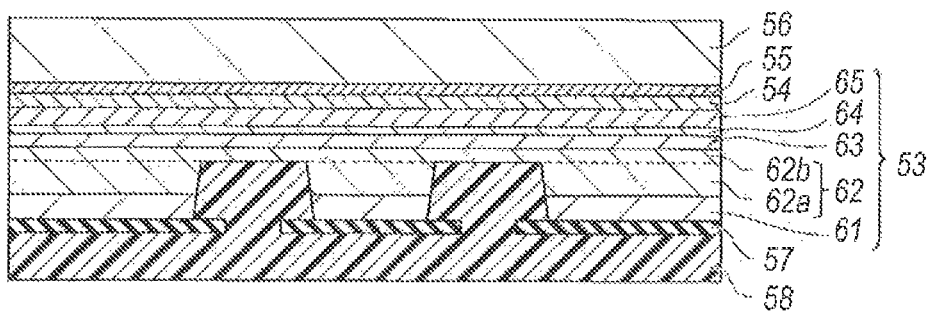
Figure 4C:
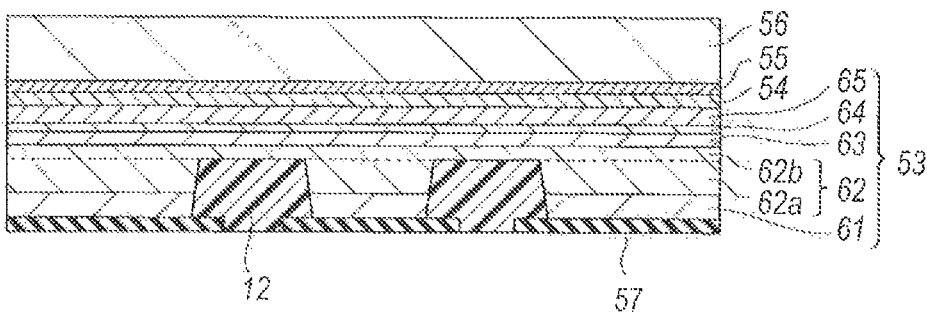

The process then fills the recess 41 by resin 58 as the fifth step shown in FIG. 4B. Specifically, resin 58 fills the recess 41 and deposits on the etching mask 57 by using, for instance, a spin coater or the like. Subsequently, the process removes a portion of the deposited resin 58 on the etching mask 57 by the chemical mechanical polishing (CMP). Thus, at least a portion of the resin 58 filled within the recess 41 is left as removing the other portion of the resin 58 which is deposited on the etching mask 57 such that a surface of the resin exposed from the recess 41 levels to the surface of the etching mask 57. Thus, the buried region 12 is formed as shown in FIG. 4C. In an alternate, the exposed surface of the resin 58 may leave a hollow by dishing during the CMP.

Figure 5A:
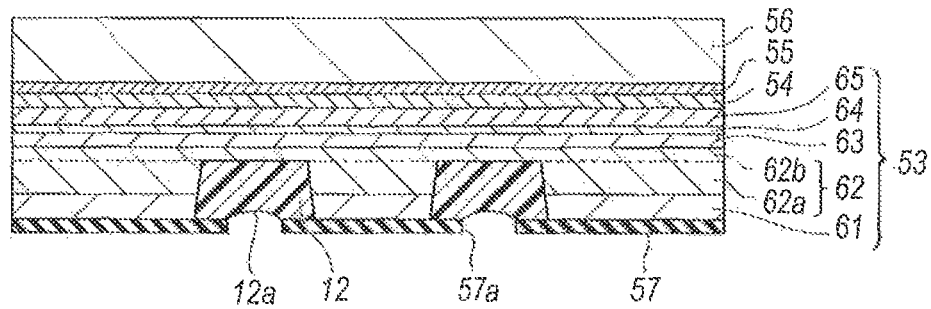
FIGS. 5A to 5C show processes subsequent to the process shown in FIG. 4C.

The process next forms a hollow 12a, as the sixth step shown in FIG. 5A, on the surface of the resin 58 exposed from the opening 57a of the etching mask 57 by, for instance, dry-etching the resin 58 using a mixed gasses of fluorocarbon ($CF_4$) and oxygen ($O_2$). The dry-etching is carried out until a portion of the resin 58 filling the opening 57a in the etching mask 57 is fully removed and a surface of the resin 58 exposed in the opening 57a is enough scooped so as to form the hollow 12a. Conditions of the dry-etching are, for instance, a flow rate of fluorocarbon ($CF_4$) of 10 sccm, that of oxygen ($O_2$) of 5 sccm, a pressure of 20 Pa, and RF power of 100 W.

Figure 5B:
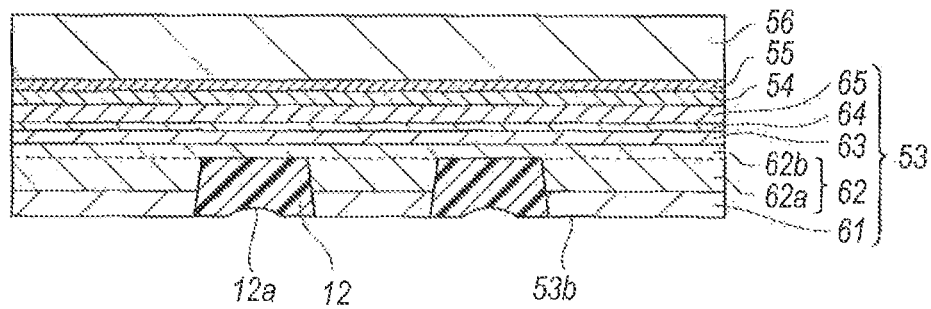
Figure 5C:
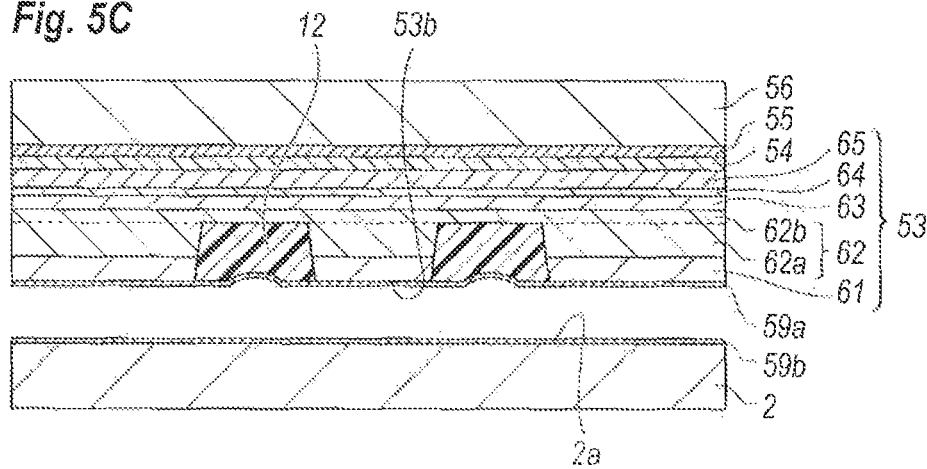

After the dry-etching shown in FIG. 5A, the process removes the etching mask 57 as the seventh step shown in FIG. 5B by, for instance, fluoric acid (HF). Then, the process prepares the support substrate 2, which is the second substrate, having a primary surface 2a provided with a metal layer 59a corresponding to the first metal layer 13, as shown in FIG. 5C. Concurrently with the preparation of the support substrate 2, the process deposits a metal layer 59b corresponding to the second metal layer 14 on the back surface 53b of the semiconductor stack 53 and the exposed surface of the resin 58 in the buried region 12. The metal layers, 59a and 59b, which may be made of tungsten (W), have the thermal conductivity greater than that of the semiconductor stack 53, while, the support substrate 2 has the thermal conductivity higher than that of the semiconductor substrate 51.

Figure 6A:
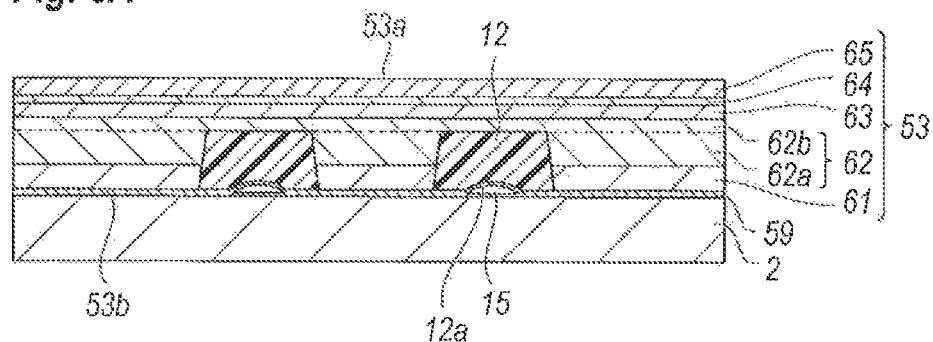
FIGS. 6A to 6C show processes subsequent to the process shown in FIG. 5C.

Next, the process attaches the support substrate 2 to the back surface 53b of the semiconductor stack 53 as the eighth step shown in FIG. 6A. Specifically, the atomic diffusion bonding (ABD) between the metal layers, 59a and 59b, may form the metal layer 59. In the cross section, the metal layers, 59a and 59b, form a gap 15 therebetween at a position corresponding to the hollow 12a formed in the exposed surface of the resin 58 in the buried region 12. Next, the process removes the temporary support 56, the adhesive layer 55, and the cover layer 54 from the semiconductor stack 53 by etching so as to expose the top surface 53a of the semiconductor stack 53.

Figure 6B:
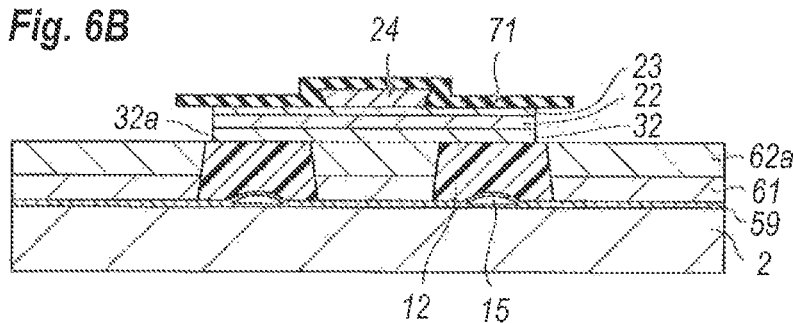

Next, the process removes as the ninth step shown in FIG. 6B a portion of the semiconductor stack 53. Specifically, wet-etching a portion of the semiconductor layer 65, the emitter contact layer 24 may be formed. Then, forming an etching mask 71 that covers at least thus formed emitter contact layer 24, the semiconductor layers, 64, 63, and 62b, are sequentially wet-etched, which forms the emitter layer 23, the base layer 22, and the upper portion 32 of the main collector layer 26. Thus, the wet-etching of those layers, 64 to 62b, partially exposes the buried region 12 in a portion outside of the outer side 32a of the upper portion 32 of the main collector layer 26.

Figure 6C:
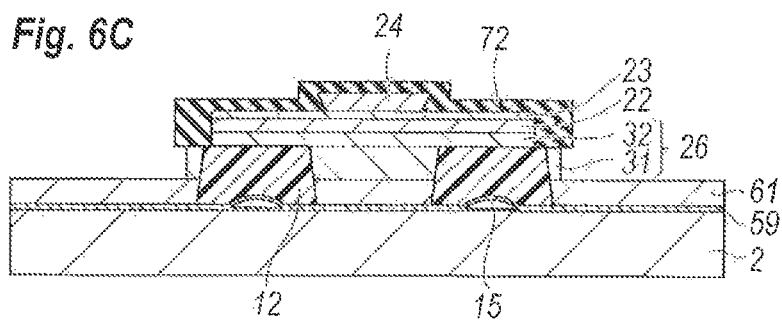

After removing the etching mask 71, the process forms as the tenth step shown in FIG. 6C another etching mask 72 again, where the etching mask 72 covers the partially exposed buried region 12, the upper portion 32 of the main collector layer 26, the base layer 22, the emitter layer 23, and the emitter contact layer 24. Wet-etching the semiconductor layer 62a, the lower portion 31 of the main collector layer 26 may be formed. Thus, the main collector layer 26 including the lower and upper portions, 31 and 32, is formed.

Figure 7A:
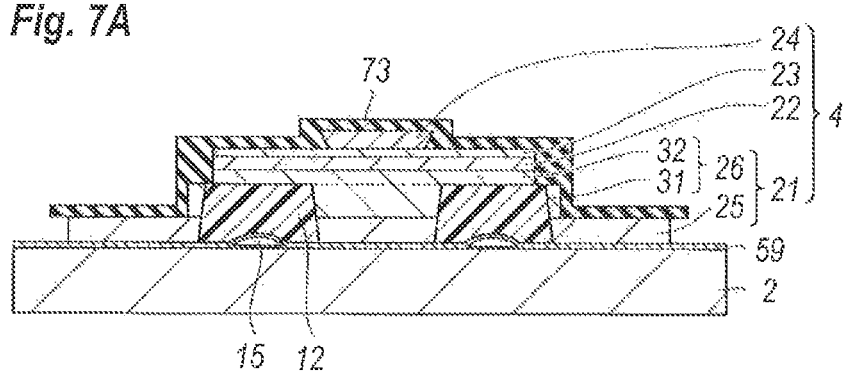
FIGS. 7A to 7C show processes subsequent to the process shown in FIG. 6C.

After removing the etching mask 72, the process forms still another etching mask 73 again, as the eleventh shown in FIG. 7A, where the etching mask 73 covers the exposed buried region 12, a portion of the exposed top of the semiconductor layer 61, and the active semiconductor stack 4. Wet-etching the semiconductor layer 61, the sub-collector layer 25 may be formed. Thus, the active semiconductor stack 4 is completed, where the active semiconductor stack 4 includes the sub-collector layer 25, the main collector layer 26, the base layer 22, the emitter layer 23, and the emitter contact layer 24.

Figure 7B:
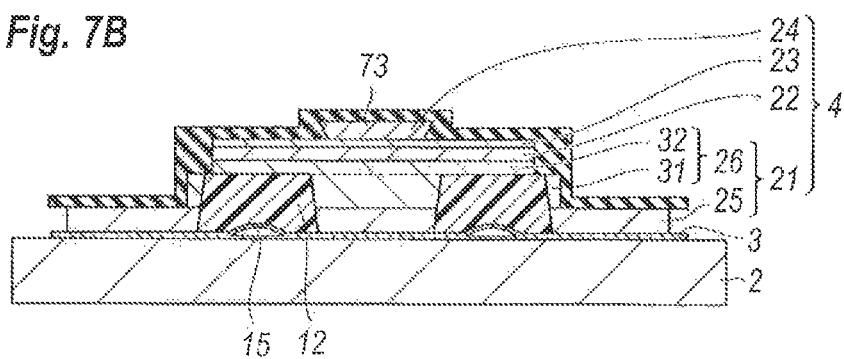
Figure 7C:
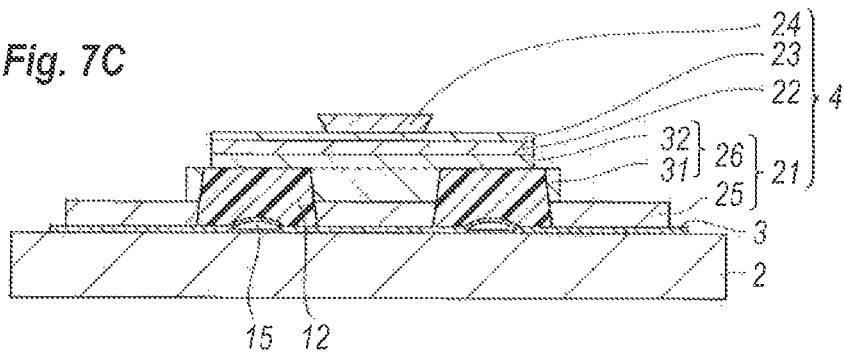

Then, the process removes, as the twelfth step shown in FIG. 7B, as leaving the etching mask 73, the metal layer 59 in a portion not overlapped with the etching mask 73 so as to leave the metal layer 3 including the first and second metal layers, 13 and 14, by the reactive ion etching (RIE). After the etching of the metal layer 59, the etching mask 73 is removed, as shown in FIG. 7C. Then, the process forms an emitter electrode 7 on the emitter contact layer 24, a collector electrode 5 on the sub-collector layer 25, and a base electrode 6 on the base layer 22, as the thirteenth step shown in FIG. 8A. As shown in FIG. 8A, the base electrode 6 is provided onto the emitter layer 23. However, the emitter layer 23 is thin enough and a heat treatment at 400° C. for one minute after the deposition of metals for the base electrode 6 to accelerate the sintering of platinum (Pt) may make the emitter layer 23 substantially transparent for the transportation of the carrier injected from the base electrode 6. Finally, the process buries the electrodes, 5 to 7, by an insulating film 8 and the selective etching of the insulating film 8 forms openings, 8a to 8c, as exposing the collector electrodes 5, the base electrode 6, and the emitter electrode 7, respectively. By patterning the interconnections, 9 to 11, the semiconductor device 1 of the type of the HBT is completed, as shown in FIG. 8B.

The semiconductor device 1 thus formed by the process according to the first embodiment provides the buried region 12, which is filled with the resin having the dielectric constant smaller than that of the collector layer 21. Thus, the parasitic capacitance of the semiconductor device 1, in particular, the parasitic capacitance around the base electrode 6 may be reduced. Referring to FIG. 2, the buried region 12 is determined by the boundaries, 42 to 44, where the inner boundary 42 coincides with the side of the sub-collector layer 25 and the side of the lower portion 31 of the main collector layer 26. The top boundary 43 coincides with the bottom surface of the upper portion 32 of the main collector layer 26. The outer boundary 44 coincides with also the side of the sub-collector layer 25 and the side of the lower portion 31 of the main collector layer 26.

The semiconductor device 1 may provide the metal layer 3 between the active semiconductor stack 4 and the support substrate 2, where the metal layer 3 attaches the active semiconductor stack 4 to the support substrate 2. Because of the metal layer 3, the heat generated within the semiconductor device 1 may be efficiently dissipated to the support substrate 2. The metal layer 3, which may be formed by attaching the first metal layer 13 to the second metal layer 14, has the void 15 between the first and second metal layers, 13 and 14, in the portion of the buried region 12. The void 15 may compensate with thermal stress caused between the active semiconductor stack 4 and the support substrate 2 during a practical operation of the semiconductor device 1. Although the embodiment provides the void 15 between the first and second metal layers, 13 and 14, voids formed between the second metal layer 14 and the support substrate 2, or those formed between the first metal layer 13 and the buried region 12 may show a function substantially same with that of the embodiment.

The buried region 12 may be filled with the resin, which may effectively suppress impurities from invading into the active semiconductor stack 4. The resin in the buried region 12 has the hollow 12a, which may effectively leave the void 15 between the first and second metal layers, 13 and 14. When the resin that fills the buried region 12 expands during the practical operation of the semiconductor device 1 by self-heating thereof, the hollow 12a, or the void 15 may effectively compensate with the thermal expansion of the resin.

The buried region 12 pierces the lower portion 31 of the main collector layer 26 so as to partially expose the top thereof; and the exposed top of the buried region 12 is directly in contact to the insulating film 8, which may isolate the active region of the active semiconductor stack 4 from the sub-collector 25 provided outside of the buried region 12.

First Modification

Figure 10:
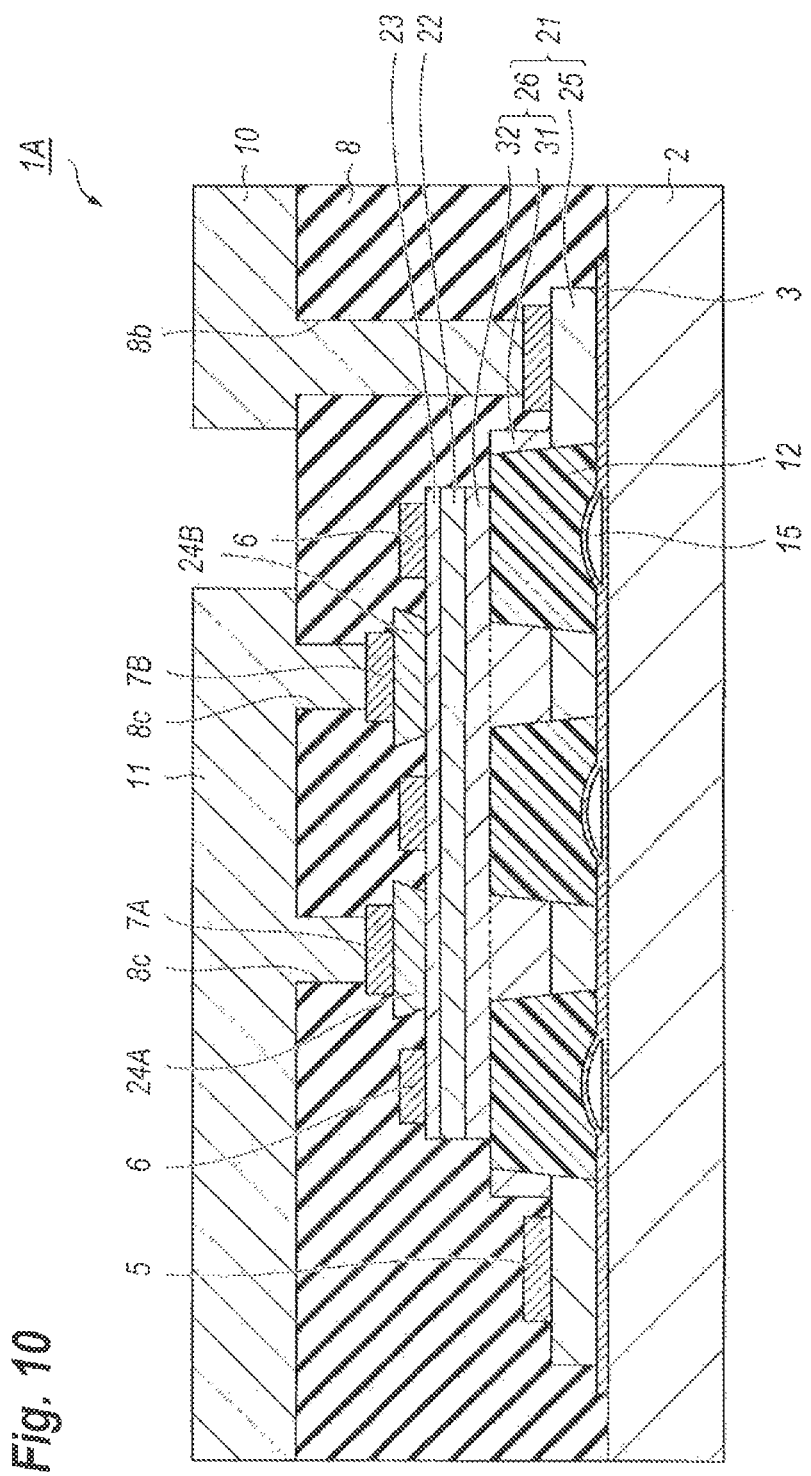
FIG. 10 shows a cross section of the modified semiconductor device shown in FIG. 9, where

FIG. 9 is a plan view of a semiconductor device 1A modified from the aforementioned embodiment; and FIG. 10 shows a cross section of the modified embodiment of the semiconductor device 1A, which is taken along the line X-X indicated in FIG. 9. The semiconductor device 1A has two emitter contact layers, 24A and 24B, physically isolated to each other on the emitter layer 23 which is common to those emitter contact layers, 24A and 24B. The emitter contact layer 24A provides the electrode 7A, while, the other emitter contact layer 24B provides another electrode 7B, where those electrodes, 7A and 7B, are electrically connected to the interconnection 11. The semiconductor device 1A provides three base electrodes 6 physically connected to each other, two of which sandwich two emitter electrodes, 7A and 7B, and the rest of the base electrode 6 is provided between the emitter electrodes, 7A and 7B. The buried region 12 is provided beneath respective base electrodes 6. Thus, the buried region 12 shows an E-shaped plain arrangement.

Second Modification

Figure 11:
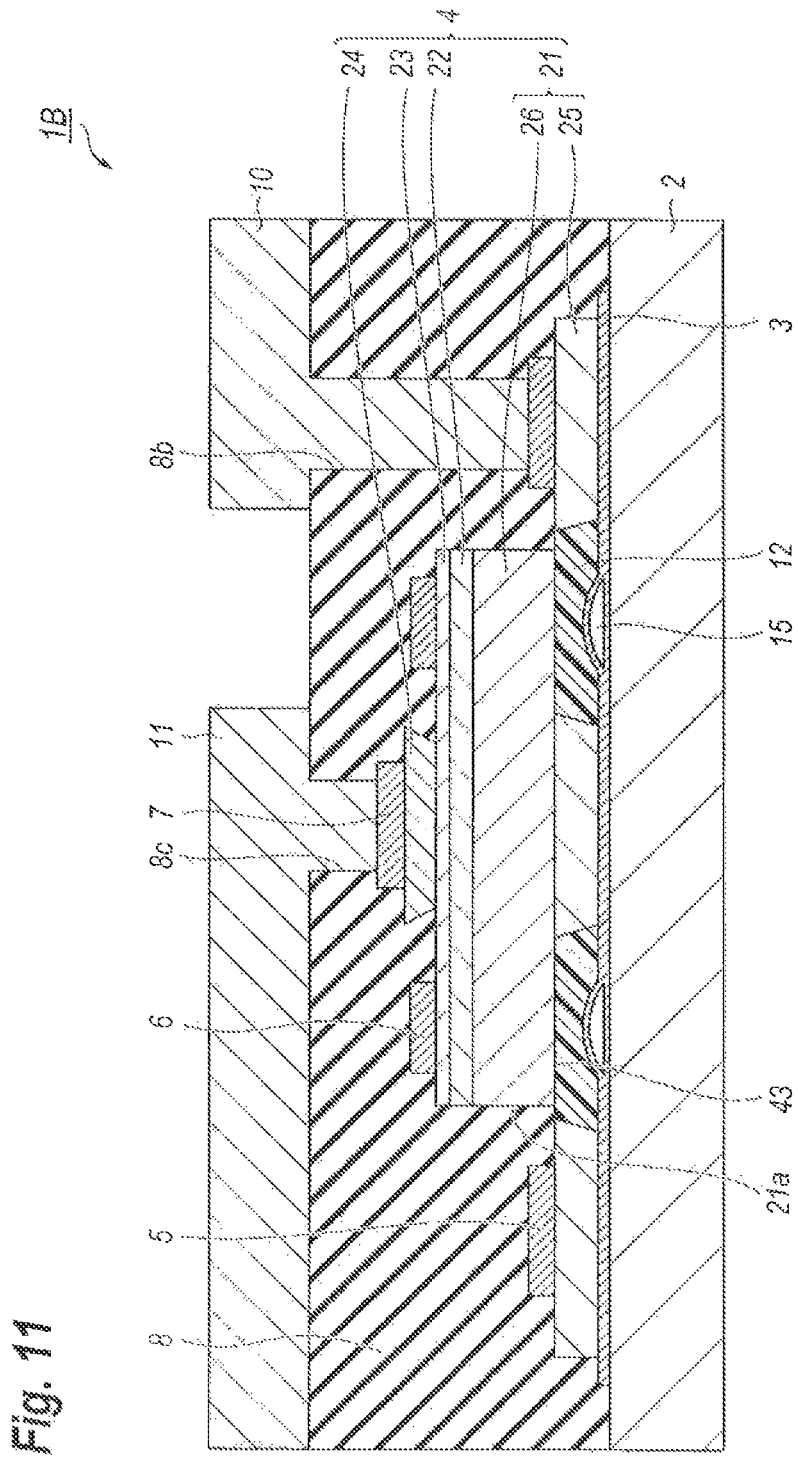
FIG. 11 is a cross section of a semiconductor device still modified from the semiconductor device shown in FIG. 1.

FIG. 11 shows a cross section of a semiconductor device 1B according to still another modification of the aforementioned semiconductor device 1. The semiconductor device 1B of the present modification, as shown in FIG. 11, also has the buried region 12 but the buried region of the present modification is provided only in the sub-collector layer 25. The top boundary 43 of the buried region 12 coincides with a bottom surface of the main collector layer 26 and partially coincides with the top surface of the sub-collector layer 25 so as to be in contact to the insulating film 8. In this modification, a distinction between the lower portion 31 and the upper portion 32 in the main collector layer 26 becomes meaningless. The buried region 12 provided only in the sub-collector layer 25 may effectively reduce the parasitic capacitance around the base electrode 6.

Third Modification

Figure 12:
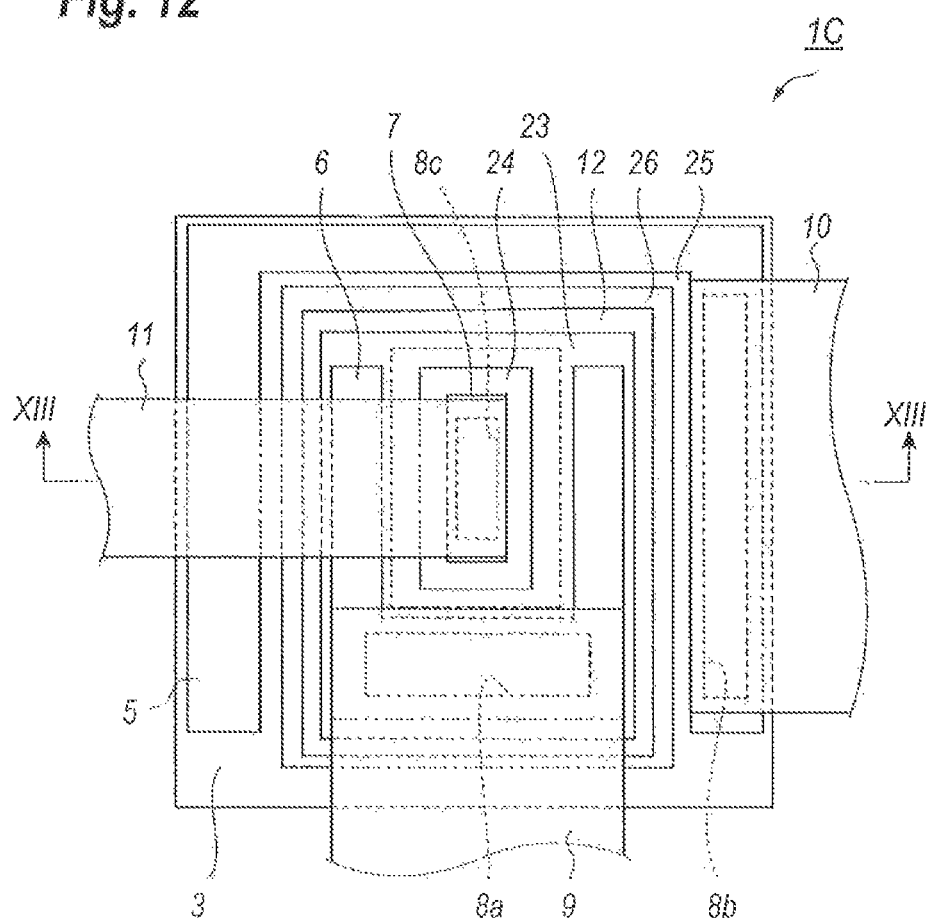
FIG. 12 is a plan view of a semiconductor device sill modified from the semiconductor device shown in FIG. 1.
Figure 13:
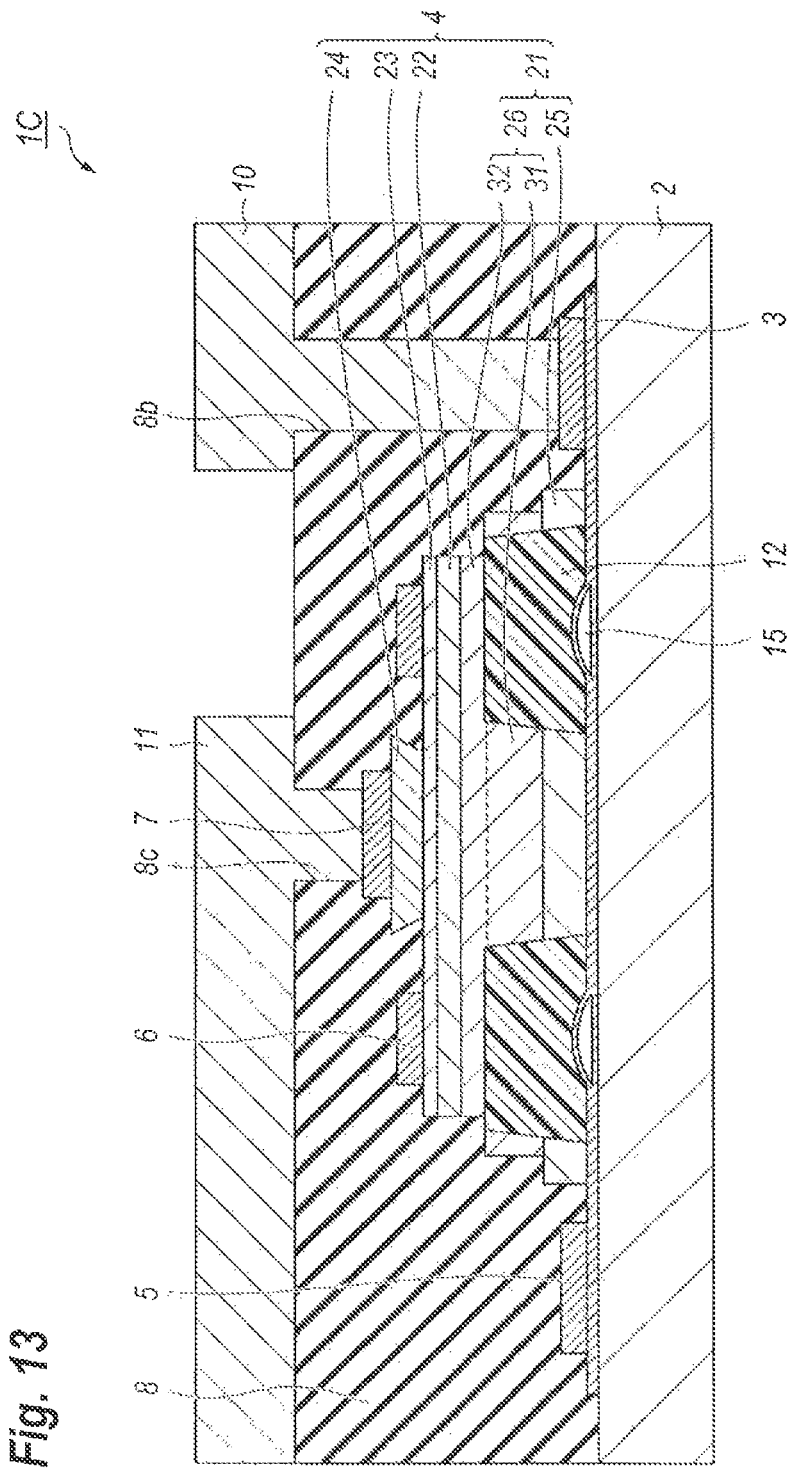
FIG. 13 shows a cross section of the modified semiconductor device shown in FIG. 12, where

FIG. 12 is a plan view of a semiconductor device 1C according to still another modification of the aforementioned semiconductor device 1, and FIG. 13 shows a cross section of the semiconductor device 1C taken along the line XIII-XIII indicated in FIG. 12. The semiconductor device 1C, as shown in FIG. 12, has a feature where the buried region 12 has a plane arrangement fully surrounding the emitter contact layer 24, and the collector electrode 5 is formed directly on the metal layer 3 as shown in FIG. 13. Because the buried region 12 fully surrounds the active semiconductor stack 4, the carriers injected from the emitter electrode 7 only reach the metal layer 3 passing through the active region of the active semiconductor stack 4 and the metal layer 3. Accordingly, the collector electrode 5 provided directly onto the metal layer 3 may effectively collect those carriers. Even in the arrangement of the buried region 12 of the present modification, the base electrode 6 overlaps with the buried region 12 and the parasitic capacitance around the base electrode 6 may be effectively reduced.

Second Embodiment

Figure 14:
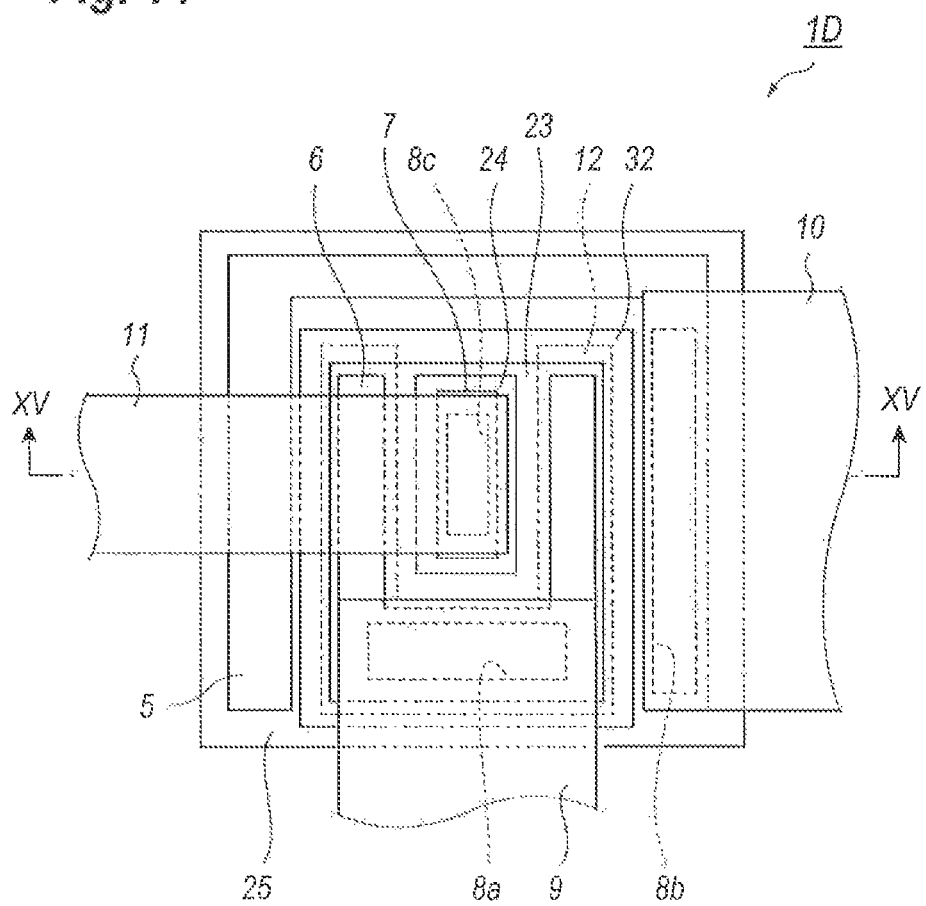
FIG. 14 is a plan view of a semiconductor device according to the second embodiment of the present invention.
Figure 15:
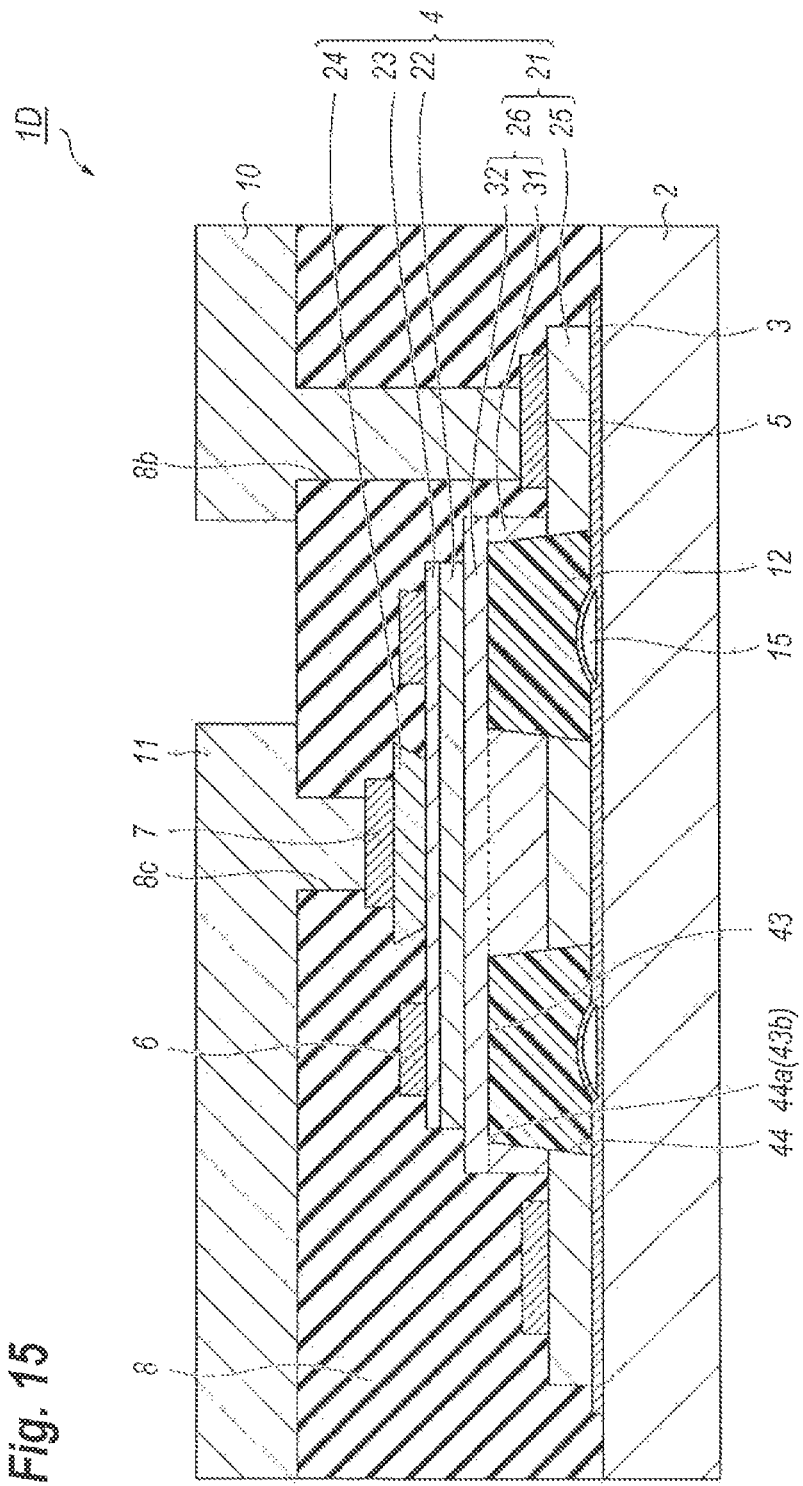
FIG. 15 shows a cross section of the semiconductor device shown in FIG. 14, where

Next, another semiconductor device 1D according to the second embodiment of the present application will be described in detail. FIG. 14 is a plan view of the semiconductor device 1D; while, FIG. 15 shows a cross section thereof taken along the line XV-XV indicated in FIG. 14. The semiconductor device 1D has a feature distinguishable from the aforementioned examples that the buried region 12 does not pierce the main collector layer 26. That is, the top boundary 43 thereof locates within the main collector layer 26 not exposed outward so as to be in contact to the insulating film 8. The outer end 43b of the top boundary 43 coincides with the top end 44a of the outer boundary 44. In the arrangement of the second embodiment, an additional current path from the active region of the active semiconductor stack 4 to the collector electrode 5 may be secured from the collector layer 26 in a portion outside of the buried region 12 to the sub-collector layer 25. The semiconductor device 1D of the present embodiment, because of the buried region 12 provided under the base electrode 6, may reduce the parasitic capacitance around the base electrode 6.

Modification of Second Embodiment

Figure 16:
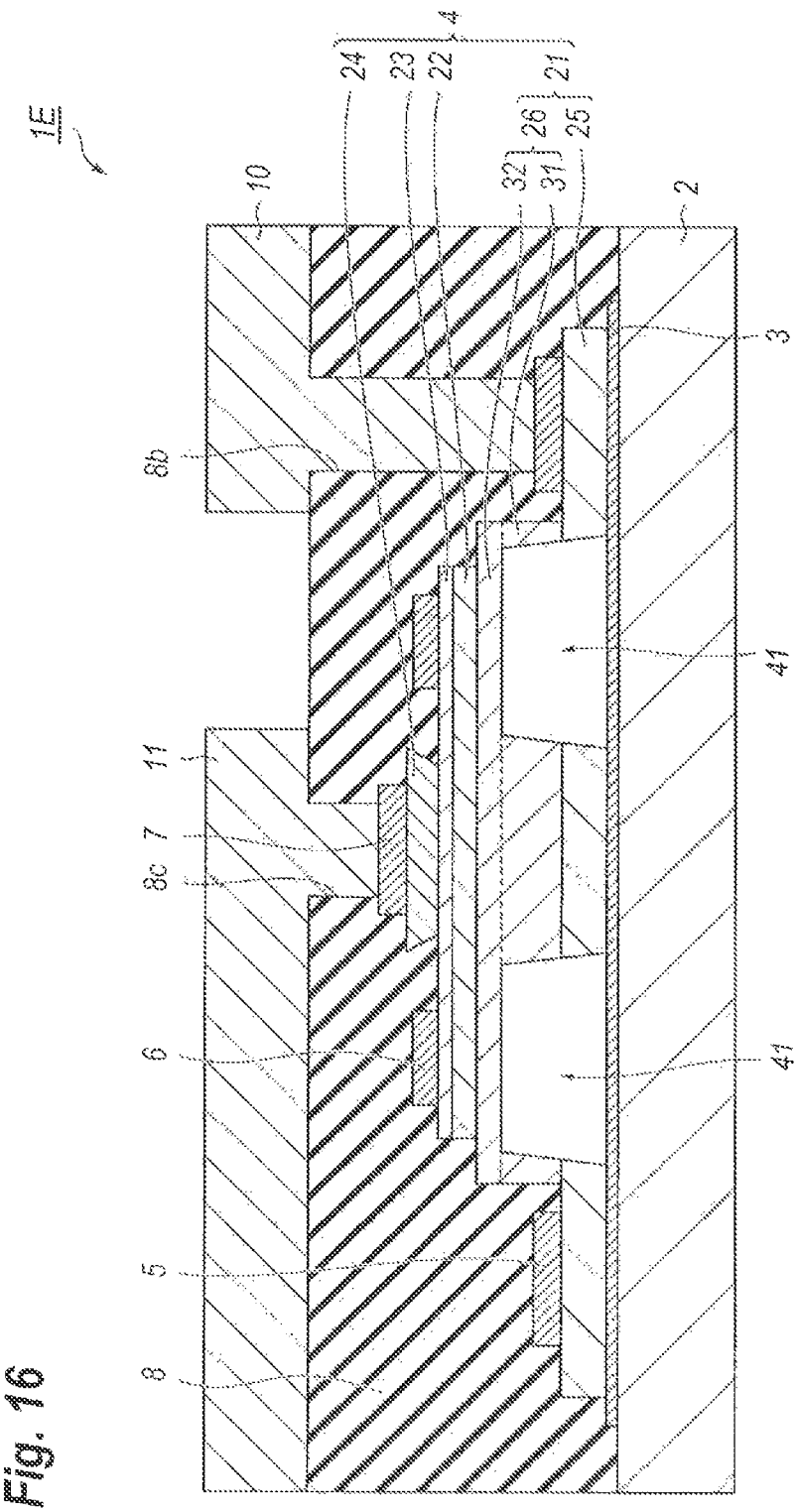
FIG. 16 shows a cross section of a semiconductor device modified from the semiconductor device shown in FIG. 14.

FIG. 16 shows a cross section of a semiconductor device 1E modified from the semiconductor device 1D of the second embodiment shown in FIGS. 14 and 15. The modified semiconductor device 1E has a feature that, as shown in FIG. 16, the recess 41 is free from the resin, that is, a whole of the recess constitutes a void filled with an air or occasionally set in a vacuum. The dielectric constant of the air, or a vacuum, is unity, the parasitic capacitance around the base electrode 6 in the present modified embodiment may be further reduced.

Third Embodiment

Figure 17:
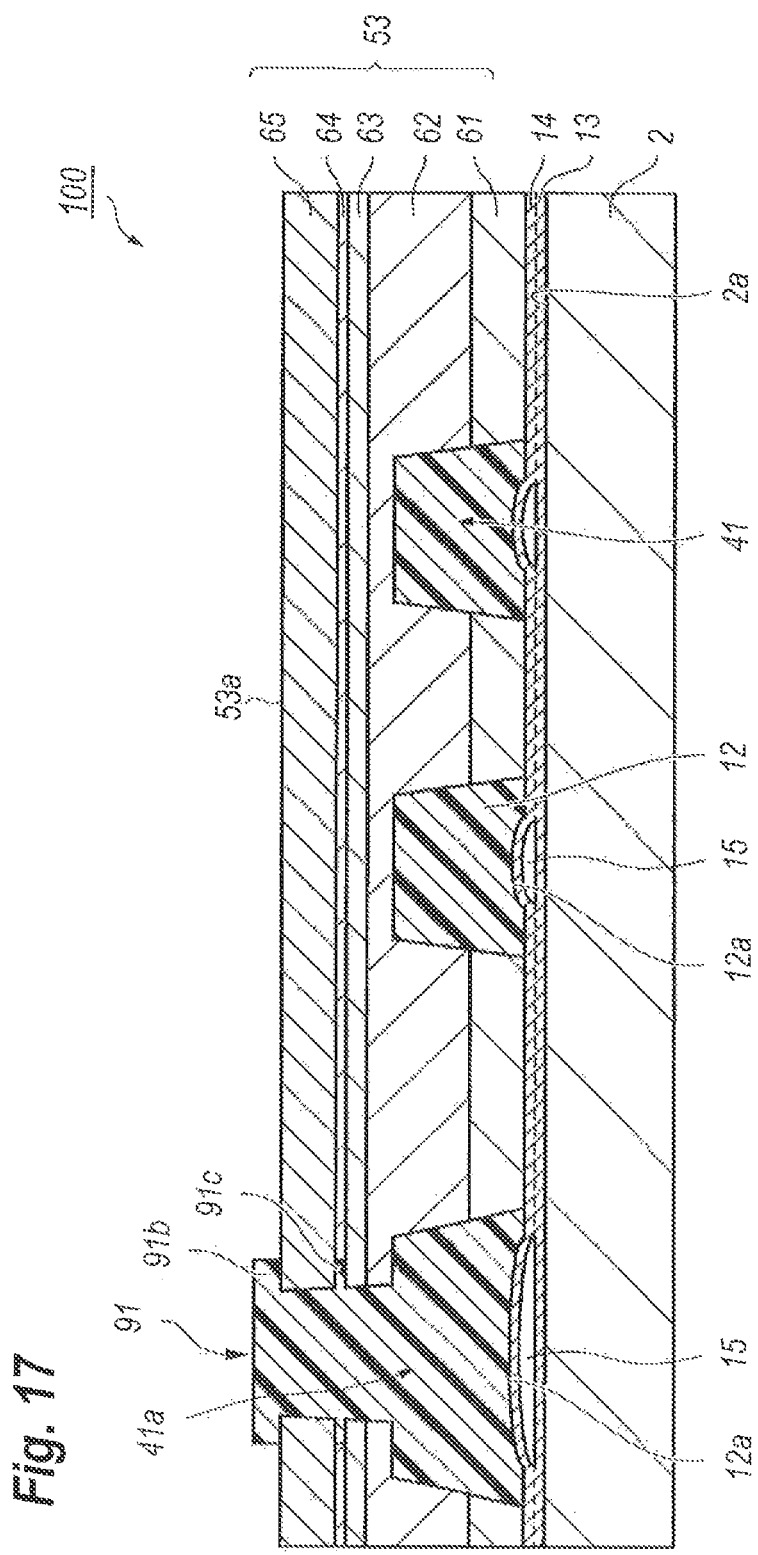
FIG. 17 shows a cross section of an intermediate product of a semiconductor device according to the third embodiment of the present application.

FIG. 17 shows a cross section of an intermediate product of a semiconductor device 1F according to the third embodiment of the present application at a step corresponding to the tenth step showing in FIG. 6A. The intermediate product 100 shown in FIG. 17 has a feature distinguishable from those shown in FIG. 6A that the intermediate product 100 includes an alignment mark 91 and another recess 41a filled with resin.

The intermediate product 100 shown in FIG. 17 may have one alignment mark 91 or two or more alignment marks 91 in a periphery of the support substrate 2. The alignment mark 91 has a recess 41a that fully passes the semiconductor layers, 61 to 65, in the semiconductor stack 53 and is filled with the insulating resin, which may be made of BCB same with the aforementioned embodiment. The alignment mark 91, in particular, the resin filling the recess 41a has the hollow 12a, which is also same with those of the resin filling the recesses, 41. The hollow 12a in the resin filling the recess 41a causes the gap 15 that compensates the thermal expansion of the resin filling the recess 41a. The resin filling the recess 41a of the alignment mark 91 is exposed on the top surface 53a of the semiconductor stack 53 so as to form an exposed portion 91b; while; protrudes 91c into the semiconductor layer 64 to be converted into the emitter layer 23 due to an excess etching during the formation of the recess 41a. The buried regions 12 and/or the alignment mark 91, similar to those of the aforementioned embodiment, may be formed by filling the recess 41 with the resin. The resin forming the buried region 12 may be same with the resin filling the recess 41a for the alignment mark.

Next, a method to produce the intermediate product 100 for the semiconductor device of the present embodiment will be described as referring to FIGS. 18A to 21C.

Figure 18A:
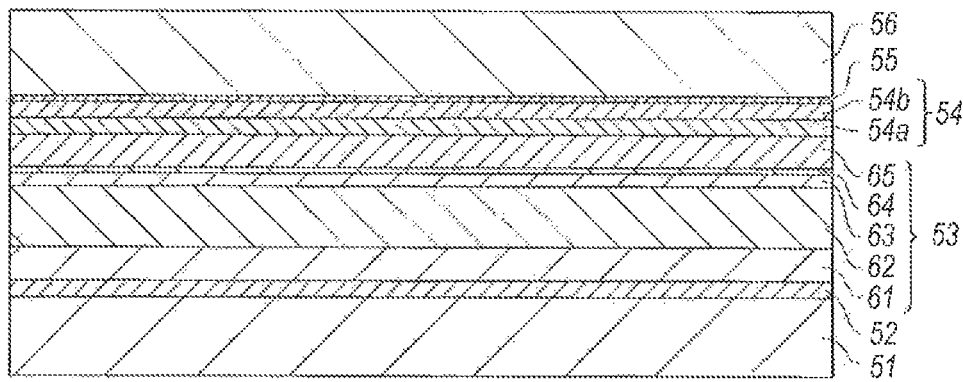
FIGS. 18A to 18C show processes to form the intermediate product shown in FIG. 17.

First, as shown in FIG. 18A, the process prepares a semiconductor substrate 51, on which the cover layer 52, the semiconductor stack 53, the cover layer 54, the adhesive layer 55, and the temporary support 56 are formed in this order. Specifically, the process sequentially grows the cover layer 52, the semiconductor stack 53, and the cover layer 54 on the semiconductor substrate 51; then, a metal layer on the top of the cover layer 54 is thermally bonded to another metal layer provided on a surface of the temporary support 56 by, for instance, the atomic diffusion bonding (ADB). The ADB may form the adhesive layer 55. Thus, the temporary support 56 may be adhered onto the cover layer 54 through the adhesive layer 55.

The cover layer 54 may be made of composite layer including a first semiconductor layer 54a that shows an etching rate enough different from an etching rate of the topmost semiconductor layer 65 in the semiconductor stack 53 and a second semiconductor layer 54b having an etching rate enough different from the etching rate of the first semiconductor layer 54a. That is, the first semiconductor layer 54a may be made of InP with a thickness of 200 nm; while, the second semiconductor layer 54b may be made of InGaAs with a thickness of 200 nm, both of which may be epitaxially grown. The adhesive layer 55 may be made of tungsten (W) formed by the sputtering.

Figure 18B:
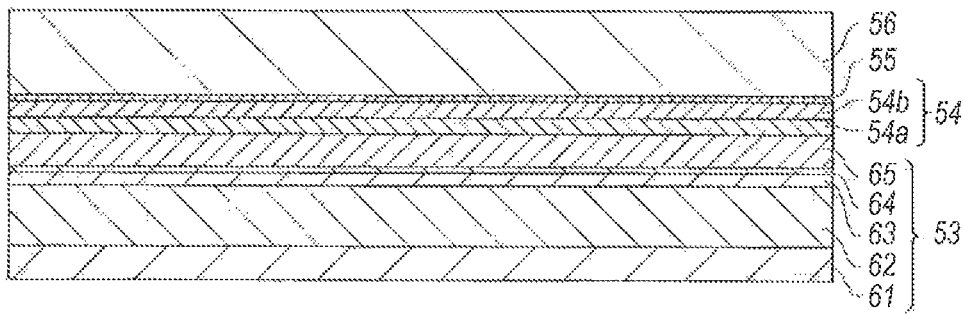
Figure 18C:
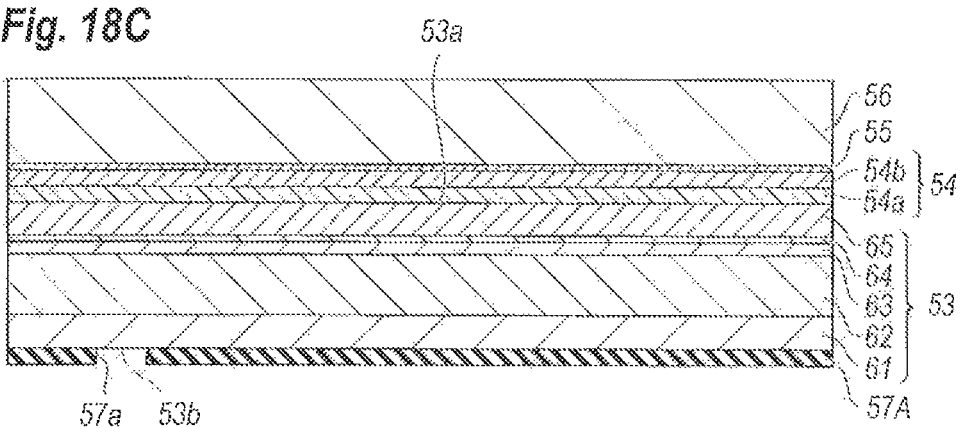

The process next removes the semiconductor substrate 51 and the cover layer 52 at the second step shown in FIG. 18B by wet-etching and/or dry-etching; then, the process forms, as a first additional step shown in FIG. 18C, a patterned etching mask 57A onto the back surface 53b of the semiconductor stack 53, which is exposed by the prior step. The etching mask 57A may be made of inorganic material containing silicon (Si), typically, silicon nitride (SiN), silicon oxide (SiOx), and so on. The etching mask 57A has openings 57a in which the back surface 53b of the semiconductor stack 53 is exposed.

Next, the process etches a portion of the semiconductor stack 53 at a second additional step as shown in FIG. 19A. Specifically, wet-etching the semiconductor layers 61 to 65, in the semiconductor stack 53 overlapped with the portion exposed in the opening 57a of the etching mask 57A, the process may dig a recess 41a that fully passes the semiconductor layers, 61 to 65. The wet-etching of the present step uses various etchants, or, combinations of the etchants with etching times may dig the recess 41a with a maximum width thereof greater than a width of the opening 57a. That is, the etching mask 57A in the opening 57a thereof forms an overhang.

Next, after the removal of the etching mask 57A, the process forms another etching mask 57B on the back surface 53b of the semiconductor stack 53 as the third step shown in FIG. 19B. The second etching mask 57B provides the opening 57b overlapped with the recess 41a and other openings 57c. The process may fill the recess 41a formed in the previous step just after the removal of the etching mask 57A; then, the process may form the other etching mask 57B on a plane surface of the resin filling the recess 41a. The resin may be removed after the formation of the openings, 57b and 57c, so as to recover the recess 41a.

Then, at the fourth step, portions of the semiconductor stack 53 are etched so as to dig the recess by the opening 57c and to widen the recess 41a by the etching mask 57B, as shown in FIG. 19C. Specifically, wet-etching the portions of the semiconductor layers, 61 and 62, where these layers are made of n-type InP, digs the recess 41 by using chloric acid (HCl) whose concentration may be adjusted, and the recess 41a, which is previously formed, is widened in the semiconductor layers, 61 and 62, and the semiconductor layer 54a, which is made of n-type InP is slightly etched in a portion exposed in a bottom of the recess 41a.

Figure 20A:
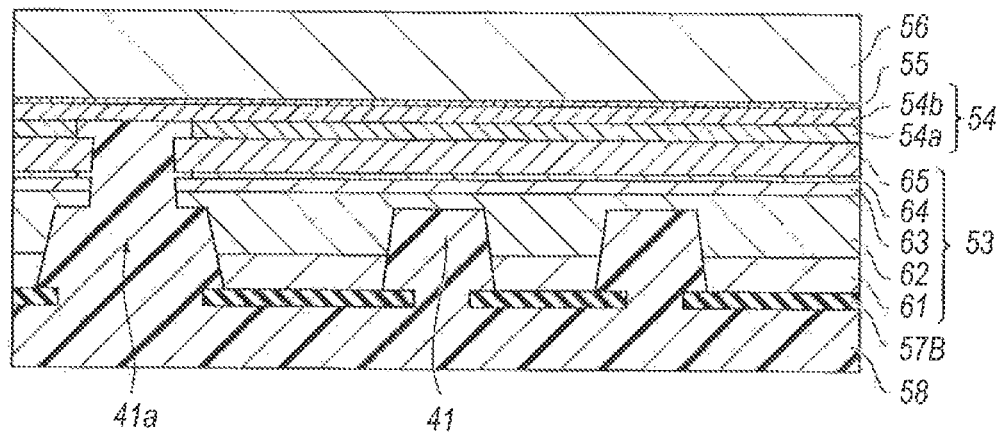
FIGS. 20A to 20C show processes subsequent to the process shown in FIG. 19C.
Figure 20B:
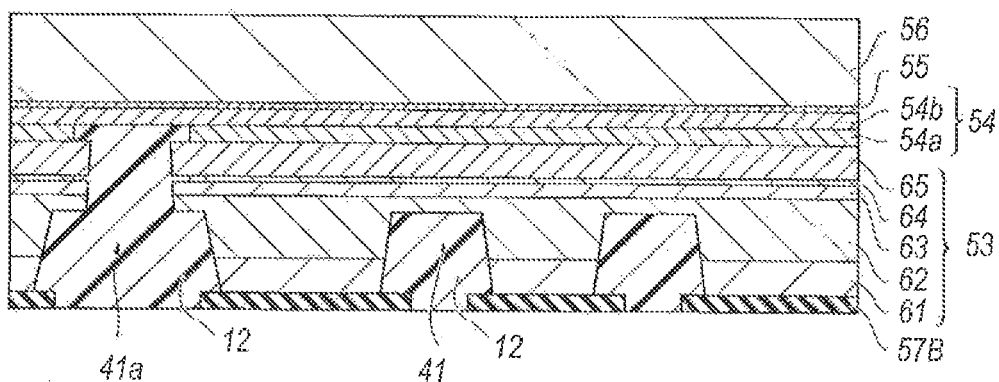

Next, as the fifth step shown in FIG. 20A, the process deposits the resin 58 on the etching mask 57B and concurrently fills the recesses, 41a and 41 by, for instance, spin-coating. Then, as the sixth step shown in FIG. 20B, the thus deposited resin 58 is removed in a portion on the etching mask 57B by, for instance, the chemical mechanical polishing (CMP) to form a leveled surface of the etching mask 57B and the resin 58 in the recesses, 41a and 41. Thus, only the resin 58 within the recesses, 41a and 41, are left to form the alignment mark 91 and the buried region 12. In the planarization process above, in particular, in the CMP, the exposed surface of the resin 58 may form hollows 12a by, what is called, dishing.

Figure 20C:
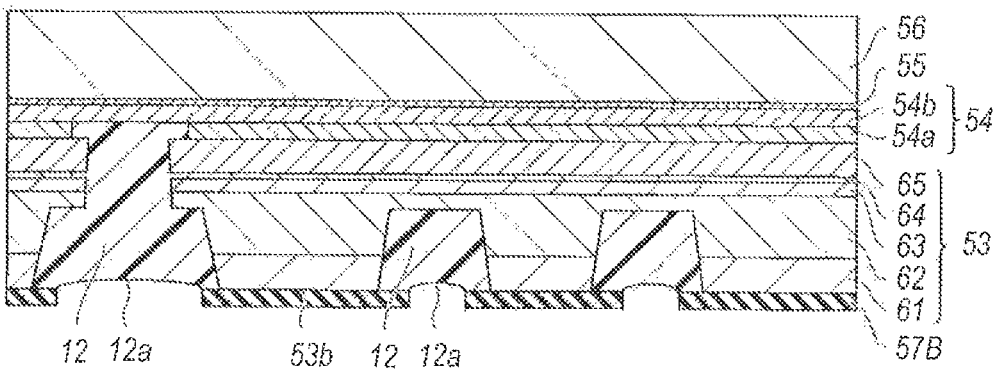

Next, as the seventh step shown in FIG. 20C, the process forms, sometimes widens hollows 12a of the buried regions 12 by etching portions of the resin 58 filling the recesses, 41a and 41, corresponding to the thickness of the etching mask 57B. Specifically, the dry-etching may partly remove the resin 58 to form the hollows 12a, or may expand the hollow 12a already formed in the previous CMP process. Typical conditions of the reactive ion etching are a mixture of reactive gasses of fluorocarbon ($CF_4$) and oxygen ($O_2$) with flow rates of 10 sccm and 5 sccm, respectively; a reaction pressure of 20 Pa, and microwave power to cause reactive plasma of 100 W.

Figure 21A:
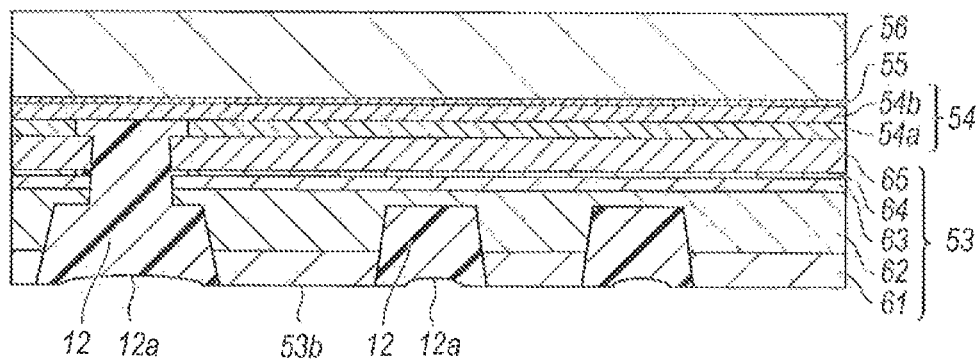
FIGS. 21A to 21C show processes subsequent to the process shown in FIG. 20C.
Figure 21B:
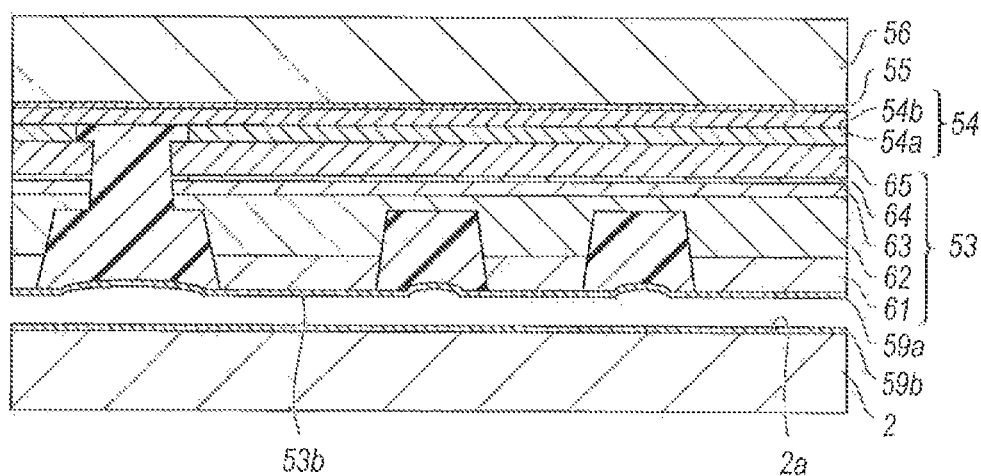

Next, as the eighth step shown in FIG. 21A, the process removes the etching mask 57B by, for instance, fluoric acid when the etching mask 57B is made of inorganic material containing silicon (Si), typically, silicon nitride (SiN) and/or silicon oxide (SiOx). Then, as the ninth step shown in FIG. 21B, the process deposits a metal layer 59a on the exposed back surface 53b of the semiconductor stack 53 and the exposed surfaces with respective hollows 12a of the alignment mark 91 and the buried region 12, and prepares the support substrate 2 with a metal layer 59b in a primary surface 2a thereof.

Figure 21C:
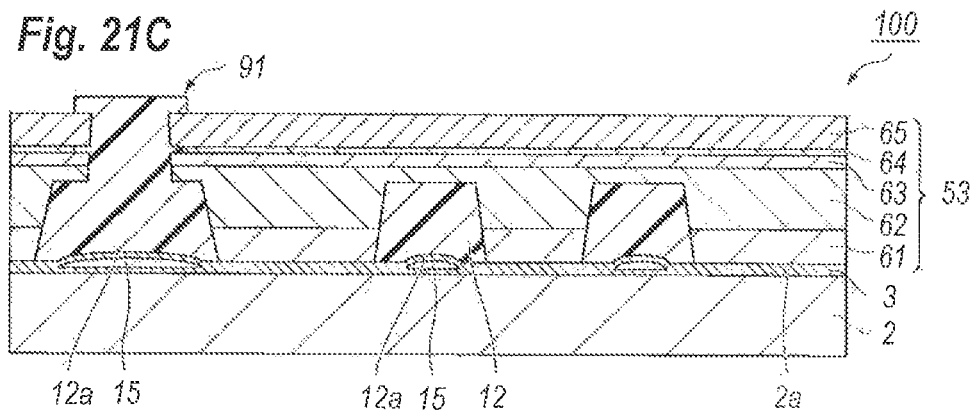

Then, as the tenth step shown in FIG. 21C, the process bonds the semiconductor stack 53 to the support substrate 2 such so as to attach the metal layers, 59a and 59b, to each other by the atomic diffusion bonding (ADB). As shown in FIG. 21C, the metal layers, 59a and 59b, leave the voids 15 in the alignment mark 91 and the buried regions 12, but are closely adhered to form the metal layer 3. After the bonding of the support substrate 2 to the semiconductor stack 53, the temporary support 56, the adhesive layer 55, and the cover layer 54 are sequentially removed by dry-etching and/or wet-etching. Thus, the intermediate product 100 shown in FIG. 17 may be obtained.

The alignment mark 91 thus formed in the intermediate product 100 is made of resin not metal; accordingly, the diffusion of metals from an alignment mark 91 into the semiconductor layers, 61 to 65, of the semiconductor stack 53 may be effectively suppressed, or substantially ignored. The alignment mark 91 in the buried region 12 thereof provides the hollow 12a and the metal layers, 59a and 59b, forming the metal layer 3 provides the void 15 in the hollowed portion of the buried region 12, which may effectively compensate the thermal expansion of the resin within the recess 41a.

Next, a method to form a semiconductor device 1F subsequent to the process for forming the intermediate product 100 shown in FIGS. 17 and 21C, will be described as referring to FIGS. 22A to 23B, where the process forms a hetero-bipolar transistor (HBT).

Figure 22A:
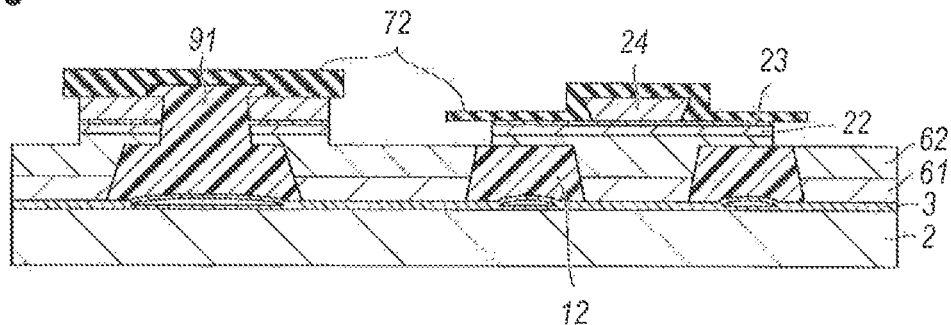
FIGS. 22A to 22C show processes to form the semiconductor device of the third embodiment on the intermediate product.

The process of the embodiment, as the eleventh step shown in FIG. 22A, partially removes the semiconductor stack 53. Specifically, the process forms the emitter contact layer 24 by wet-etching the topmost semiconductor layer 65. Preparing an etching mask covering at least a portion to be formed in the emitter contact layer 24 and the alignment mark 91, the wet-etching the topmost layer 65 forms the emitter contact layer 24. Then, forming an etching mask 72 so as to cover at least portions to be formed in the emitter layer 23 and the base layer 22, and the alignment mark 91, the semiconductor layers, 64 and 63, are sequentially wet-etched. The etching mask 72 may be aligned in patterns thereof with the alignment mark. At the wet-etching, the semiconductor layer 64 may show a function of the etching-stop layer for the etching of the semiconductor layer 65 around the alignment mark, and the semiconductor layer 63 may play a role of the etching-stop layer for the etching of the semiconductor layer 64. The sequential etching may form the emitter layer 23 in the semiconductor layer 64 and the base layer 22 in the semiconductor layer 63. The etching of the semiconductor layer 64 may partially etch the semiconductor layer 62 such that the resin in the buried region 12 is exposed in the outer sides of the base layer 22.

Figure 22B:
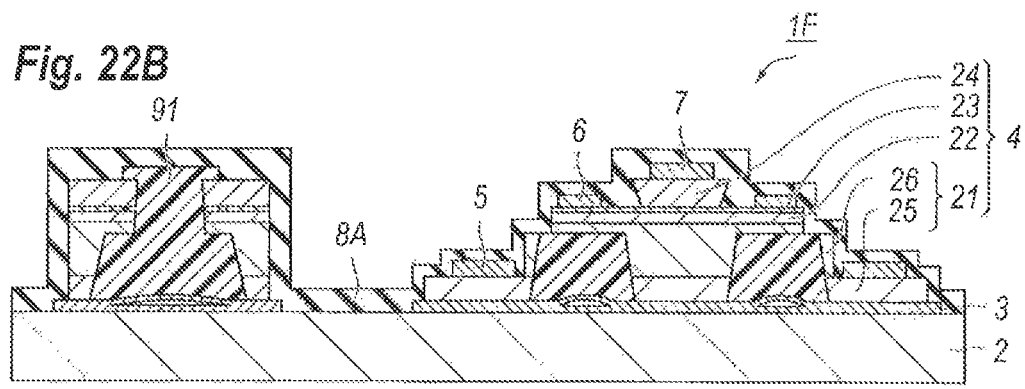

Next, as the twelfth step shown in FIG. 22B, the process etches the semiconductor layers, 62 and 61, and the metal layer 3 to from the collector layer 21 including the main collector layer 26 and the sub-collector layer 25. Thus, an active semiconductor stack 4 of the semiconductor device 1F may be formed where the active semiconductor stack 4 includes, from the top thereof, the emitter contact layer 24, the emitter layer 23, the base layer 22 and the collector layer 21. The active semiconductor stack 4 is divided from the alignment mark 91 but includes the buried region 12. Because the alignment mark 91 and semiconductor layers around the alignment mark 91 are covered with the etching mask for the collector layer 21, the alignment mark 91 may be left as keeping the arrangement thereof. Then, as the thirteenth step, the process forms electrodes, 5 to 7, on the active semiconductor stack 4. Specifically, the process forms the base electrode 6 on the emitter layer 23, the emitter electrode 7 on the emitter contact layer 24, and the collector electrode 5 on the sub-collector layer 25, where the emitter layer 23 is formed thin enough for carriers injected from the base electrode 6 to be regarded as a transparent layer. Subsequently, the process covers the active semiconductor stack 4 and the alignment mark 91 by an insulating film 8A, which may be made of silicon nitride (SiN). The insulating film 8A is directly in contact to the primary surface 2a of the support substrate 2. That is, after removing the metal layer 3 between the active semiconductor stack 4 and the alignment mark 91, the insulating film 8A is deposited directly onto the support substrate 2.

Figure 22C:
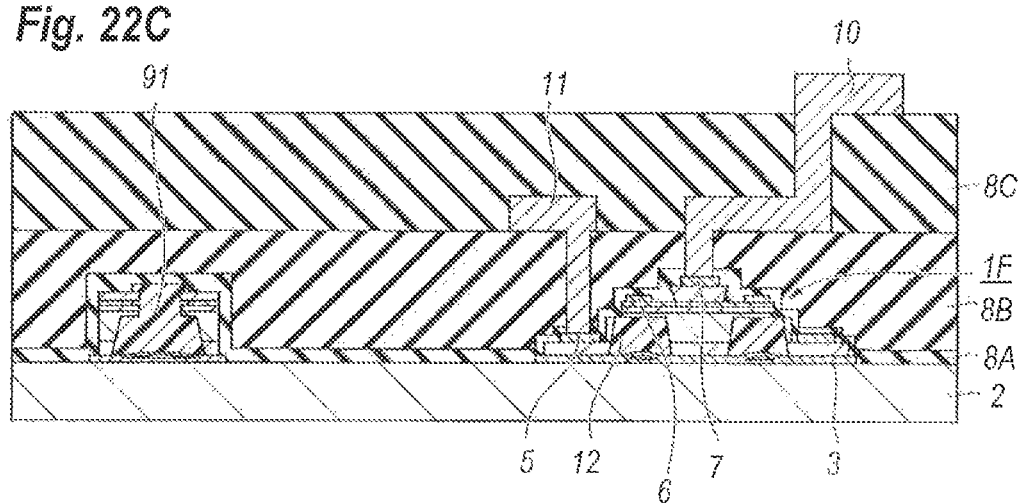

Then, the process forms the interconnections, 10 and 11, and other insulating films, 8B and 8C, as the fourteenth step shown in FIG. 22C. The insulating films, 8B and 8C, which may be regarded as planarization films, may be made of resin such as polyimide. Although not explicitly illustrated in FIG. 22C, another interconnection drawn out from the base electrode 6 is also formed in the present step.

Figure 23A:
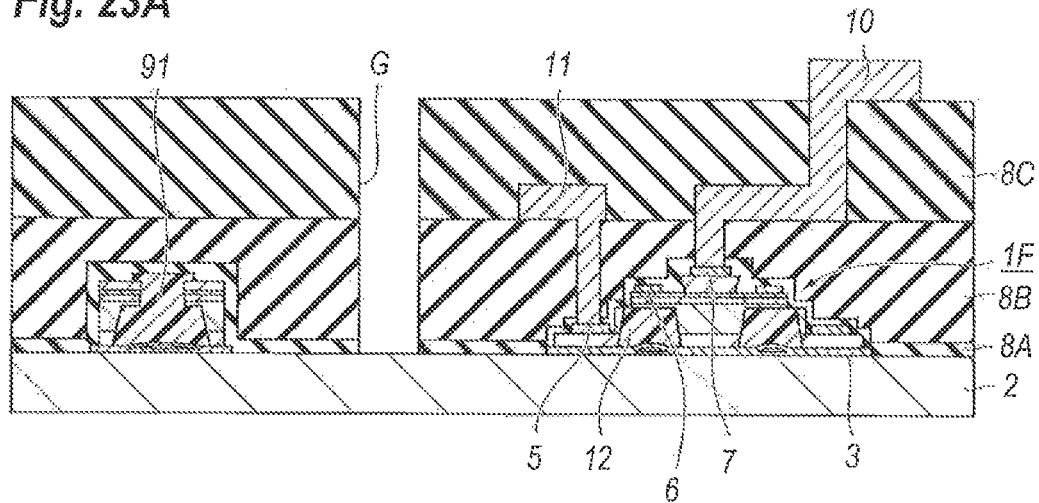
FIGS. 23A and 23B show processes subsequent to the process shown in FIG. 22C.
Figure 23B:
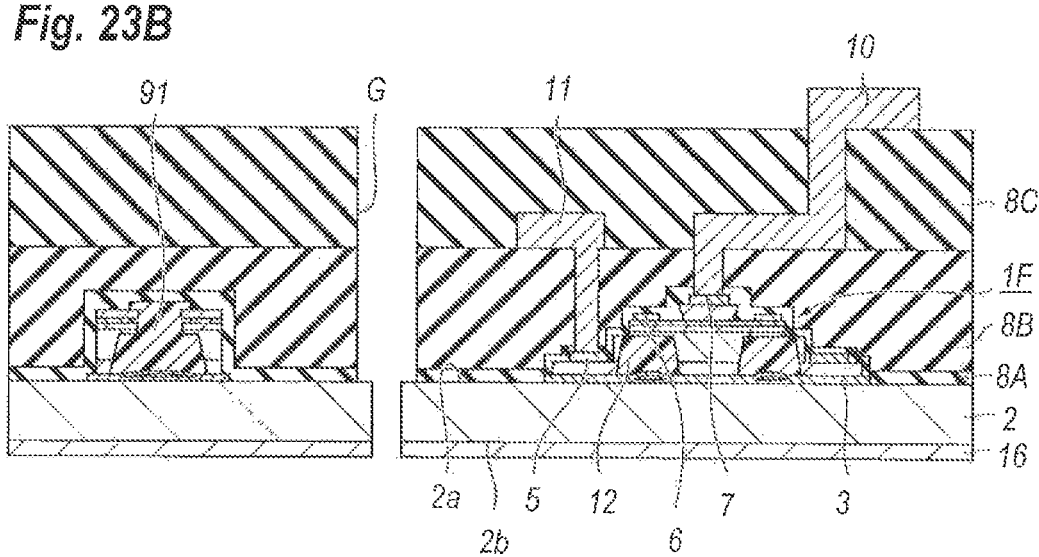

Next, the process forms, what is called, a scribe line G by partially removing the insulating films, 8B and 8C, between the semiconductor device 1F and the alignment mark 91 as the fifteenth step shown in FIG. 23A. The scribe line G exposes the primary surface 2a of the support substrate 2. Then, the process dices the support substrate 2 after thinning the support substrate 2 as the sixteenth step shown in FIG. 23B. The support substrate 2 may provide a back metal 16 in the back surface 2b thereof after thinning. The back metal 16 may be electrically connected to the interconnection formed in the primary surface 2a thereof through via holes formed in the support substrate 2, or may be electrically isolated therefrom. Dicing the support substrate 2 along the scribe line G, the semiconductor device 1F according to the third embodiment of the present application may be completed.

The foregoing descriptions of specific embodiment and examples of the present invention have been presented for purposes of illustration and description. They are not intended to be exhaustive or to limit the invention to the precise forms disclosed, and obviously many modifications and variations are possible in light of the above teaching. For instance, the semiconductor device 1D may have two or more emitter contact layers 24 physically isolated to each other as that of the modification of the first embodiment shown in FIG. 10. Also, the main collector layer 26 provides the lower portion 31 and the upper portion 32; but the main collector layer 26 may provide three or more portions. For instance, the main collector layer 26 provides the third portion between the lower and upper portions, 31 and 32, where the third portion becomes a bottom of the buried region 12 and has a doping concentration smaller than those of the lower portion 31 and the upper portion 32. The third portion may reduce a current flowing along an interface between the buried region 12 and the main collector layer 26. Also, a combination of the second embodiment with the second modification of the first embodiment may be applicable to an HBT. In such a combination, the buried region 12 is formed only in the sub-collector layer 25, or the only the sub-collector layer 25 leaves the recess 41 without being filled with the resin.

Also, the semiconductor stack 53 may include etching-stop layers. For instance, an etching-stop layer inserted between the semiconductor layers, 62 and 61, may show an etching rate far smaller than that of the semiconductor layer 62, but far faster than the semiconductor layer 61. That is, the etching for the semiconductor layer 62 is substantially stopped at the etching-stop layer, and the etching for the etching-stop layer is substantially stopped at the semiconductor layer 61. Thus, the etching-stop layer inserted between the semiconductor layers, 62 and 61, may effectively avoid an excess etching for the semiconductor layer 61. A semiconductor layer made of InGaAs, which may be etched by a diluted mixture of phosphoric acid and hydrogen peroxide, may be an etching-stop layer for a semiconductor layer made of InP, which may be etched by a chloric acid.

Thus, the examples and modifications are chosen and described in order to best explain the principles of the invention and its practical application, thereby to enable others skilled in the art to best utilize the invention and further various modifications as are suited to the particular use contemplated. It is intended that the scope of the invention be defined by the claims appended hereto and their equivalents.

What is claimed is:

1. A semiconductor device comprising:
   a support;
   an active semiconductor stack including a first semiconductor layer, a second semiconductor layer, and a third semiconductor layer, the first to third semiconductor layers being sequentially stacked on the support; and
   an electrode on the third semiconductor layer,
   wherein the first semiconductor layer and the second semiconductor layer provide a buried region in a portion under the electrode, the buried region being filled with a resin having a first dielectric constant smaller than a second dielectric constant of the first semiconductor layer and a third dielectric constant of the second semiconductor layer.

2. The semiconductor device of claim 1, wherein the second semiconductor layer includes a first portion on the first semiconductor layer and a second portion on the first portion, the buried region being provided in the first semiconductor layer and only in the first portion of the second semiconductor layer.

3. The semiconductor device of claim 1, further comprising another electrode on the first semiconductor layer and outside of the buried region.

4. The semiconductor device of claim 1, wherein the resin has a hollow facing the support.

5. The semiconductor device of claim 1,
   wherein the electrode on the third semiconductor layer and the buried region have a U-shaped plane arrangement, and
   wherein another electrode is provided at an opened portion of the U-shaped plane arrangement of the buried region.

6. The semiconductor device of claim 2, wherein the buried region exposes from the first portion of the second semiconductor layer.

7. The semiconductor device of claim 4, further comprising a metal layer between the support and the active semiconductor stack,
   wherein the metal layer provides a void in a portion under the hollow of the resin.

8. A semiconductor device comprising:
   a support;
   an active semiconductor stack including a first semiconductor layer, a second semiconductor layer, and a third semiconductor layer, the first to third semiconductor layers being sequentially stacked on the support; and
   an electrode provided on the third semiconductor layer,
   wherein only the first semiconductor layer provides a buried region in a portion under the electrode, the buried region being filled with a resin having a dielectric constant smaller than a dielectric constant of the first semiconductor layer.

9. A semiconductor device comprising:
   a support;
   an active semiconductor stack including a first semiconductor layer, a second semiconductor layer, and a third semiconductor layer, the first to third semiconductor layers being sequentially stacked from a side of the support;
   an electrode on the third semiconductor layer;
   a metal layer provided between the support and the active semiconductor stack; and
   another electrode on the metal layer,
   wherein the first semiconductor layer and the second semiconductor layer provide a buried region in a portion under the electrode on the third semiconductor layer, the buried region being filled with a material having a first dielectric constant smaller than a second dielectric constant of the first semiconductor layer and a third dielectric constant of the second semiconductor layer,
   wherein the buried region has a plane arrangement surrounding the electrode on the third semiconductor layer, and
   wherein the another electrode is provided outside of the buried region.

10. A process to from a semiconductor device, comprising steps of:
   (a) growing first to third semiconductor layers sequentially on a semiconductor substrate to form an active semiconductor stack;
   (b) attaching a temporary support on a top of the active semiconductor stack;
   (c) removing the semiconductor substrate from the active semiconductor stack;
   (d) digging a recess in at least the first semiconductor layer;
   (e) attaching a support to the first semiconductor layer;
   (f) removing the temporary support; and
   (g) forming an electrode on the third semiconductor layer at a position above the recess.

11. The process of claim 10, further including a step of filling the recess with resin after digging the recess.

12. The process of claim 10,
   wherein the step of digging the recess includes a step of digging the recess in the first semiconductor layer and a portion of the second semiconductor layer, and
   wherein the second semiconductor layer provides a first portion having the recess and a second portion having no recess.

13. The process of claim 11, further including a step of forming a hollow in a surface of the resin filling the recess.

14. The process of claim 13, further including a step of, after the step of forming the hollow but before the step of attaching the support, forming a metal layer on the resin and another metal layer on the support, and
   wherein the step of attaching the support includes a step of bonding the metal layer on the resin and the another metal layer on the support and leaving a void at a portion under the recess.

15. The process of claim 14, further including steps of:
   exposing the metal layer by removing the first semiconductor layer in a portion outside of the recess after the step of forming the electrode; and
   forming another electrode on the exposed metal layer.

16. The process of claim 12, wherein the step of digging the recess includes a step of digging the second semiconductor layer fully piercing the first portion thereof.

* * * * *